US006753219B2

United States Patent
Sekiguchi et al.

(10) Patent No.: US 6,753,219 B2
(45) Date of Patent: Jun. 22, 2004

(54) METHOD OF MANUFACTURING SEMICONDUCTOR INTEGRATED CIRCUIT DEVICES HAVING A MEMORY DEVICE WITH A REDUCED BIT LINE STRAY CAPACITY AND SUCH SEMICONDUCTOR INTEGRATED CIRCUIT DEVICES

(75) Inventors: Toshihiro Sekiguchi, Hidaka (JP); Yoshitaka Tadaki, Hanno (JP); Keizo Kawakita, Ome (JP); Hideo Aoki, Hamura (JP); Toshikazu Kumai, Dallas, TX (US); Kazuhiko Saito, Dallas, TX (US); Michio Nishimura, Plano, TX (US); Michio Tanaka, Richardson, TX (US); Katsuo Yuhara, Ibaraki-ken (JP); Shinya Nishio, Plano, TX (US); Toshiyuki Kaeriyama, Ibaraki-ken (JP); Songsu Cho, Ibaraki-ken (JP)

(73) Assignees: Hitachi, Ltd., Tokyo (JP); Texas Instruments, Inc., Dallas, TX (US)

( * ) Notice: Subject to any disclaimer, the term of this patent is extended or adjusted under 35 U.S.C. 154(b) by 0 days.

(21) Appl. No.: 10/226,290

(22) Filed: Aug. 23, 2002

(65) Prior Publication Data

US 2002/0192905 A1 Dec. 19, 2002

Related U.S. Application Data

(62) Division of application No. 08/862,320, filed on May 23, 1997, now abandoned.

(30) Foreign Application Priority Data

May 29, 1996 (JP) .............................. 8-135534

(51) Int. Cl.$^7$ .......................................... H01L 21/8242
(52) U.S. Cl. ....................... 438/253; 438/256; 438/396; 438/399; 438/638
(58) Field of Search ................................ 438/253–256, 438/239–252, 393–399, 618, 622, 637, 638, 639

(56) References Cited

U.S. PATENT DOCUMENTS

| | | | |
|---|---|---|---|
| 5,279,989 A | 1/1994 | Kim | 438/396 |
| 5,296,400 A | 3/1994 | Park et al. | 438/253 |
| 5,389,560 A | * 2/1995 | Park | 438/397 |
| 5,554,557 A | 9/1996 | Koh | 438/396 |
| 5,569,948 A | 10/1996 | Kim | 257/382 |
| 5,677,227 A | 10/1997 | Yang et al. | 277/652 |
| 5,688,713 A | 11/1997 | Linliu et al. | 438/253 |
| 5,710,073 A | 1/1998 | Jeng et al. | 438/239 |
| 5,914,279 A | 6/1999 | Yang et al. | 438/724 |

* cited by examiner

*Primary Examiner*—Jack Chen
(74) *Attorney, Agent, or Firm*—Antonelli, Terry, Stout & Kraus, LLP

(57) ABSTRACT

A DRAM has, in one embodiment, a plurality of word lines each having its upper and side surfaces covered with a first insulating film, a plurality of bit lines each being provided so as to be insulated from and transverse to the word lines and being covered with a second insulating film, and a plurality of memory cells each provided at an intersection between one word line and one bit line and including a capacitor and a memory cell selection transistor, in which contact holes for connection between semiconductor regions and capacitors and between semiconductor regions and bit lines are formed in self-alignment and the second insulating film is made of a material having a permittivity smaller than that of the first insulating film.

7 Claims, 39 Drawing Sheets

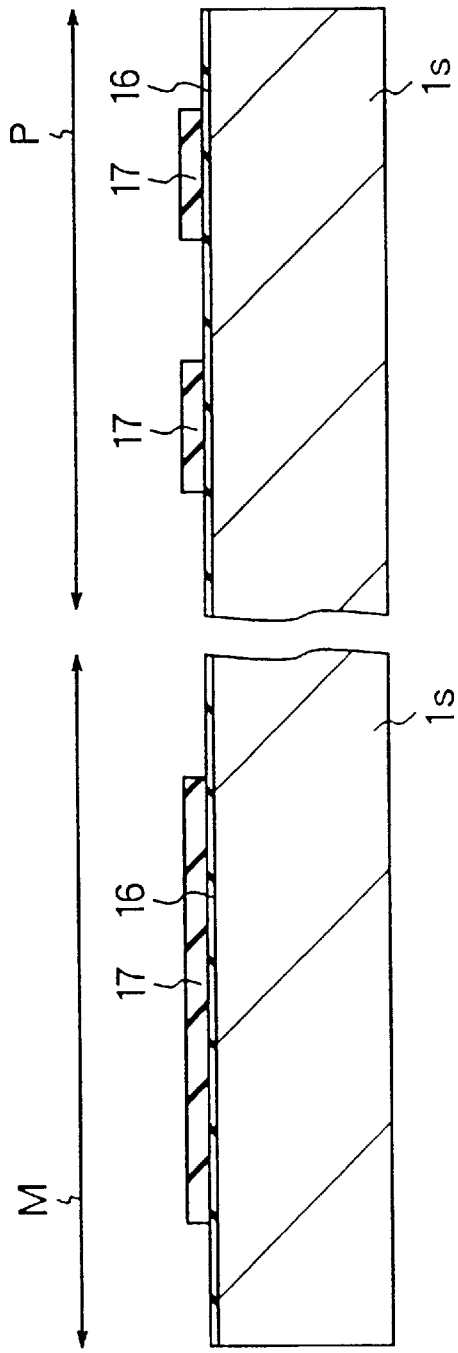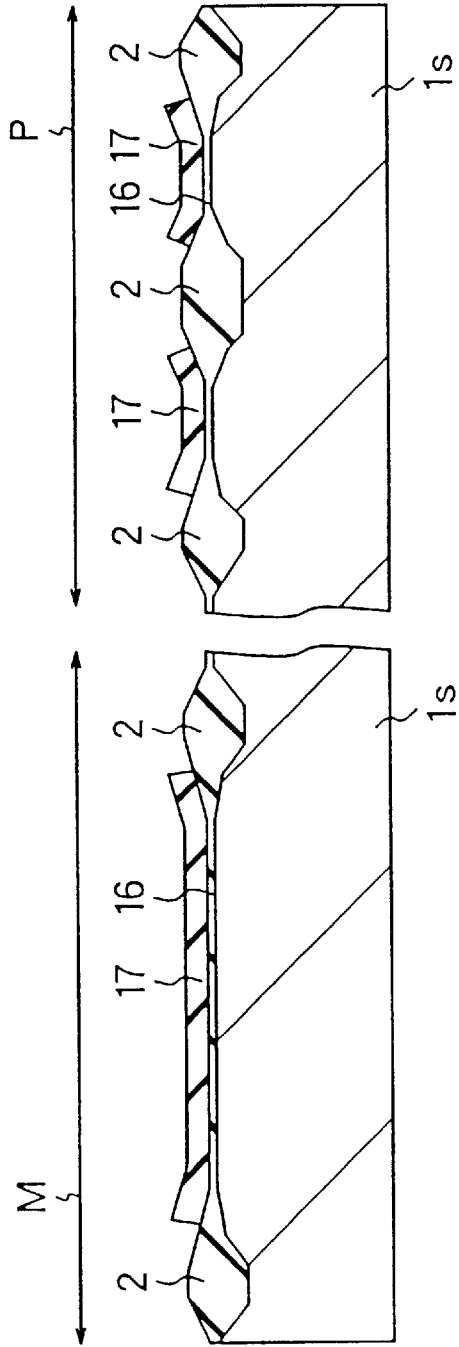

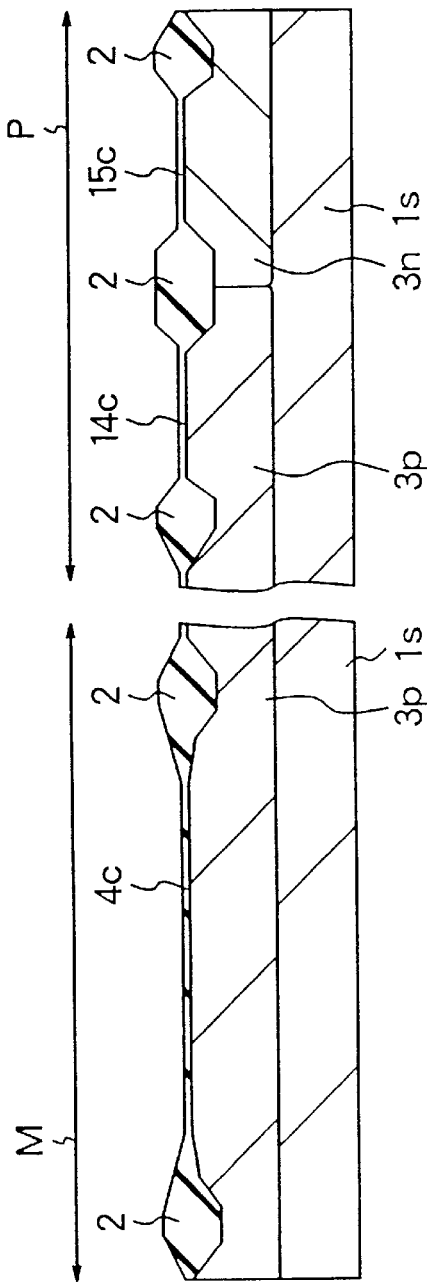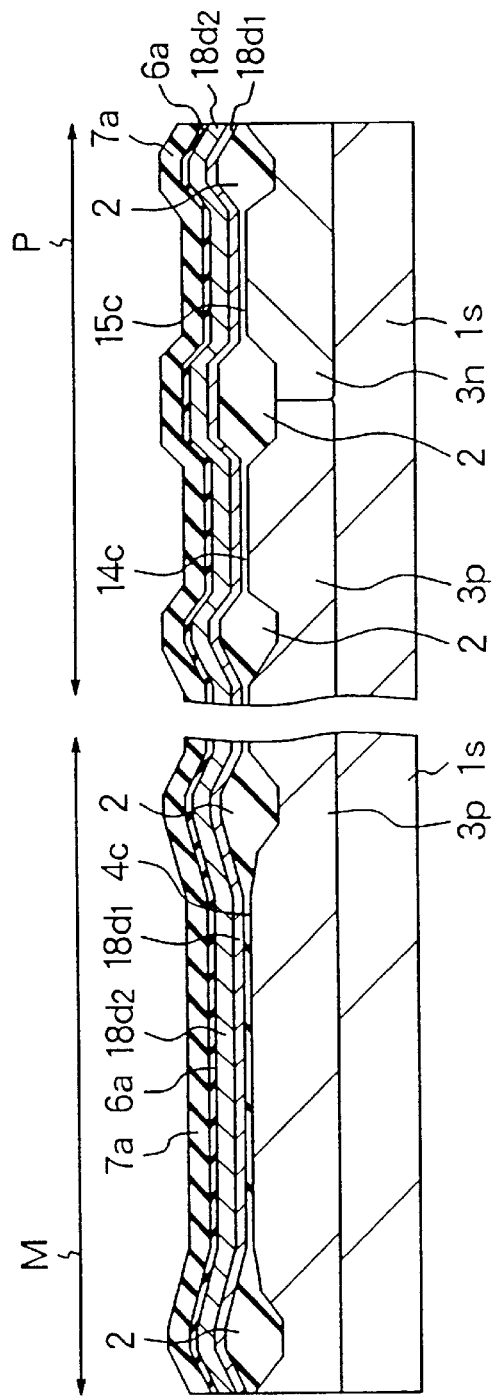

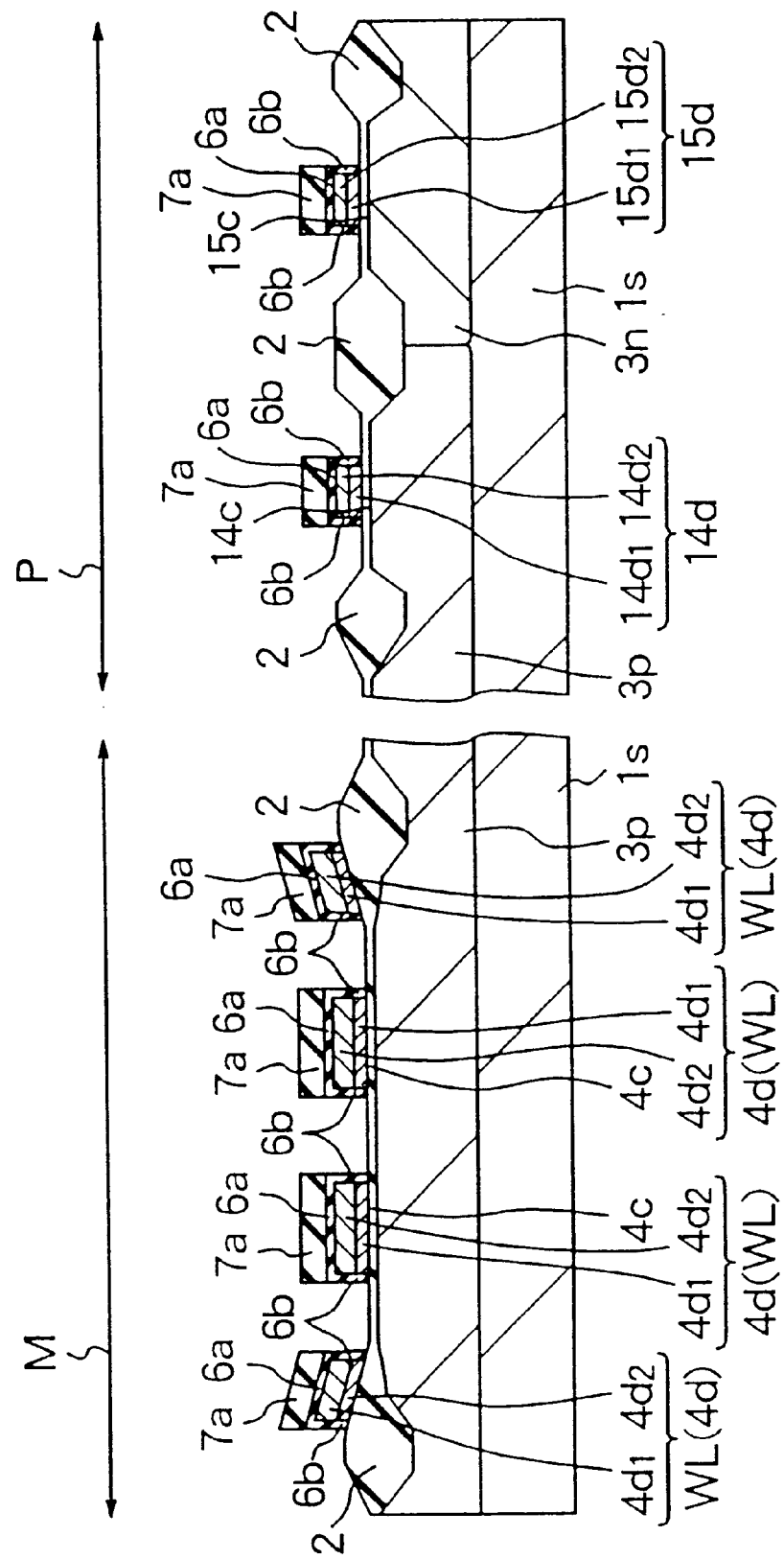

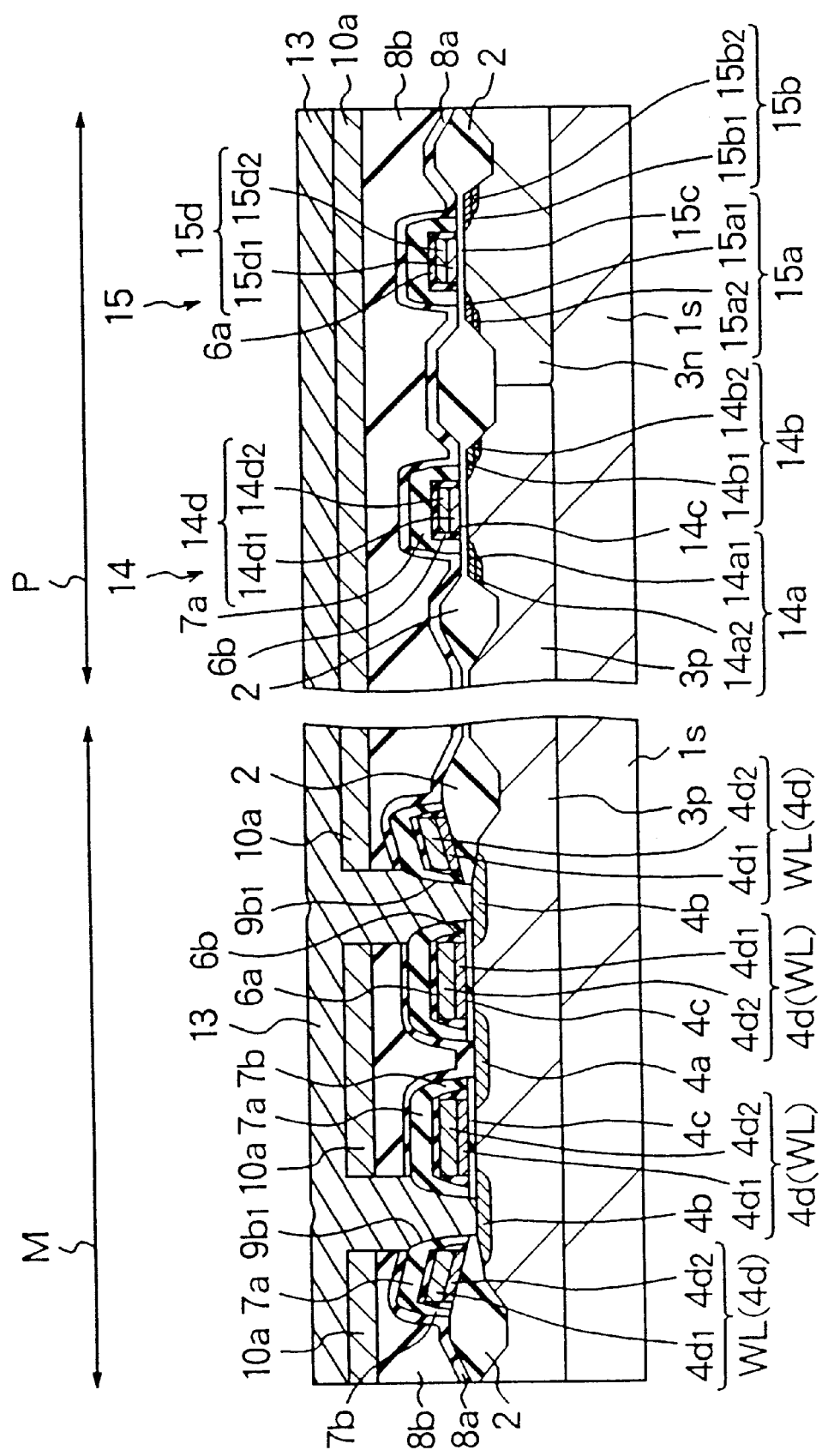

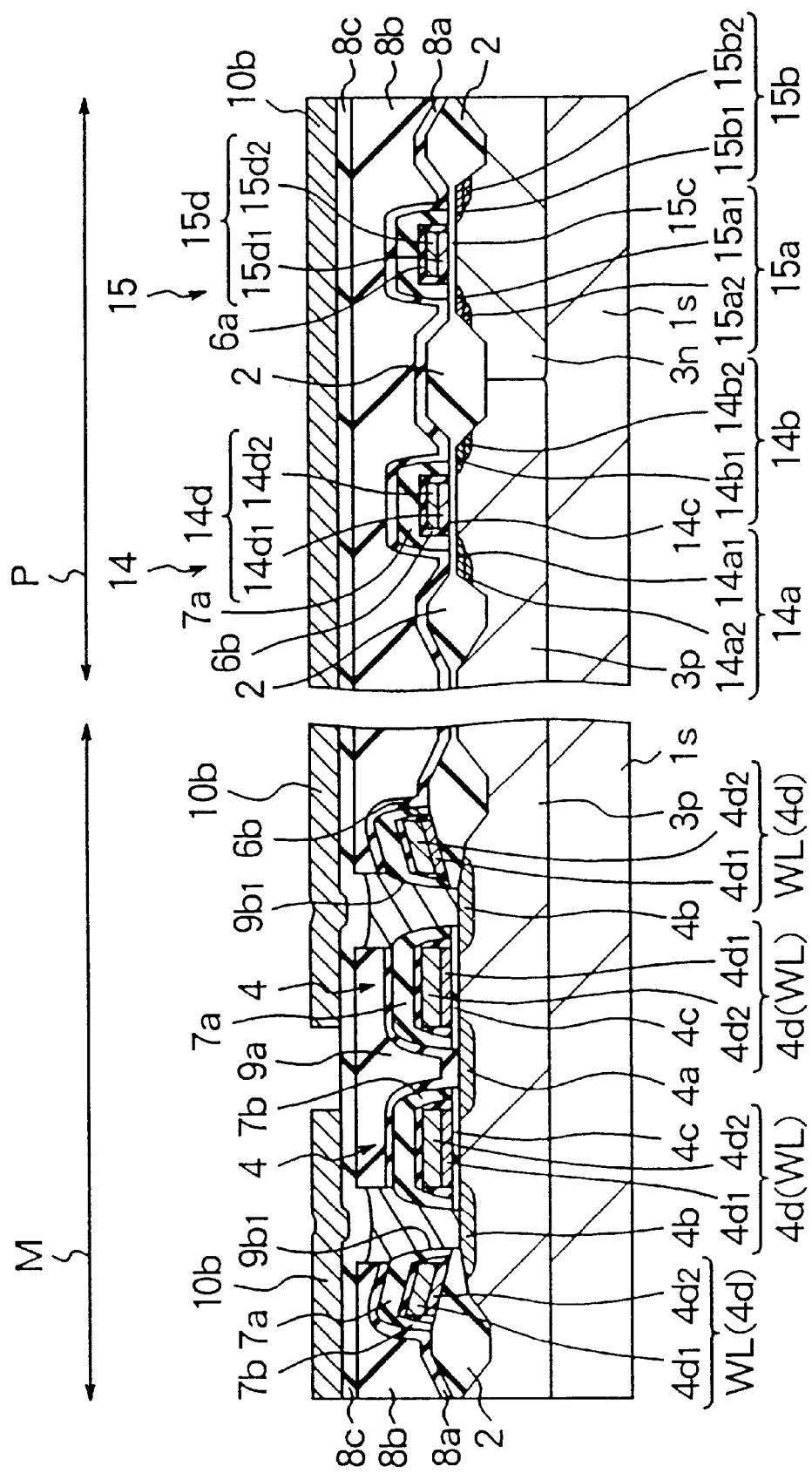

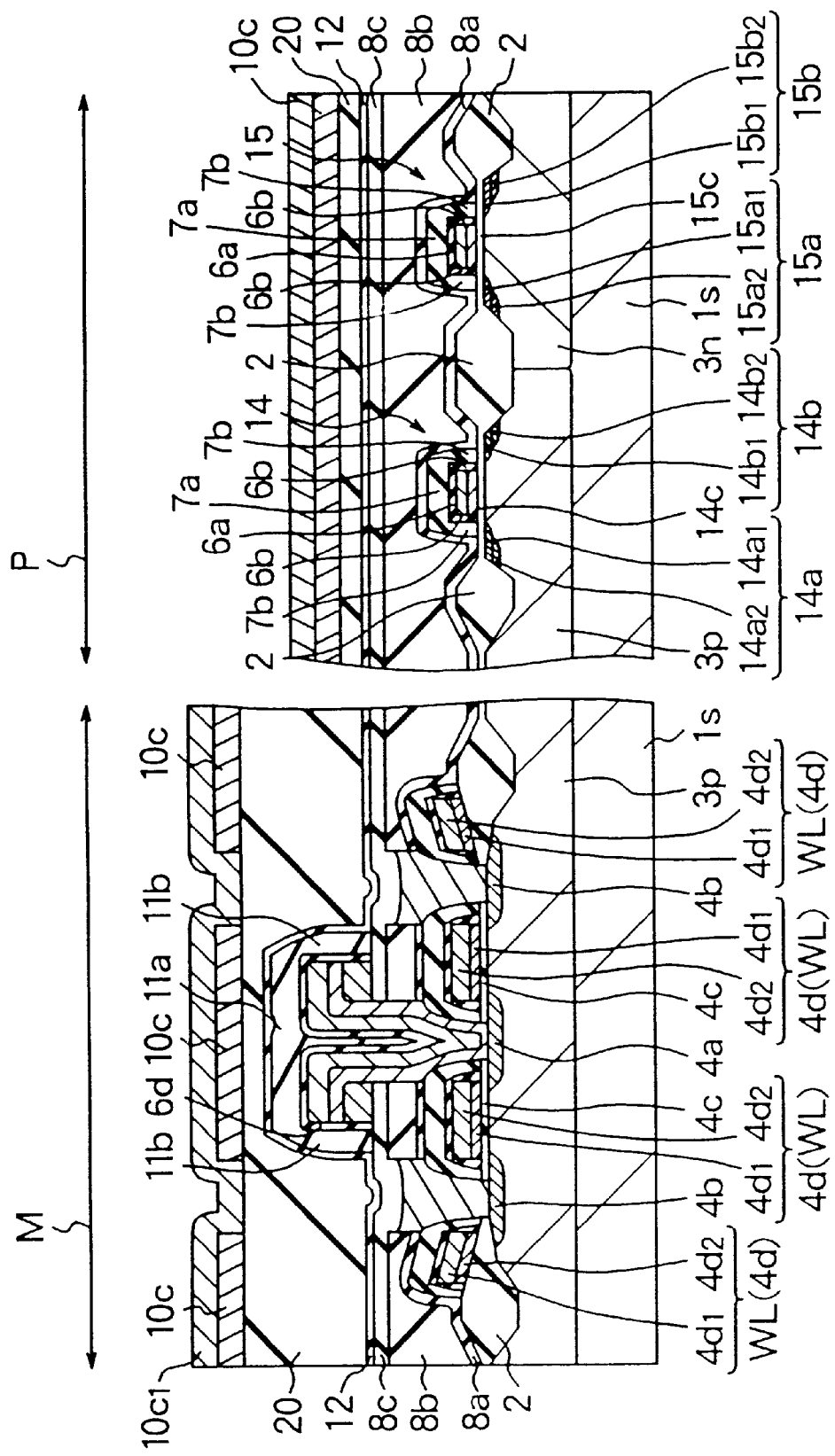

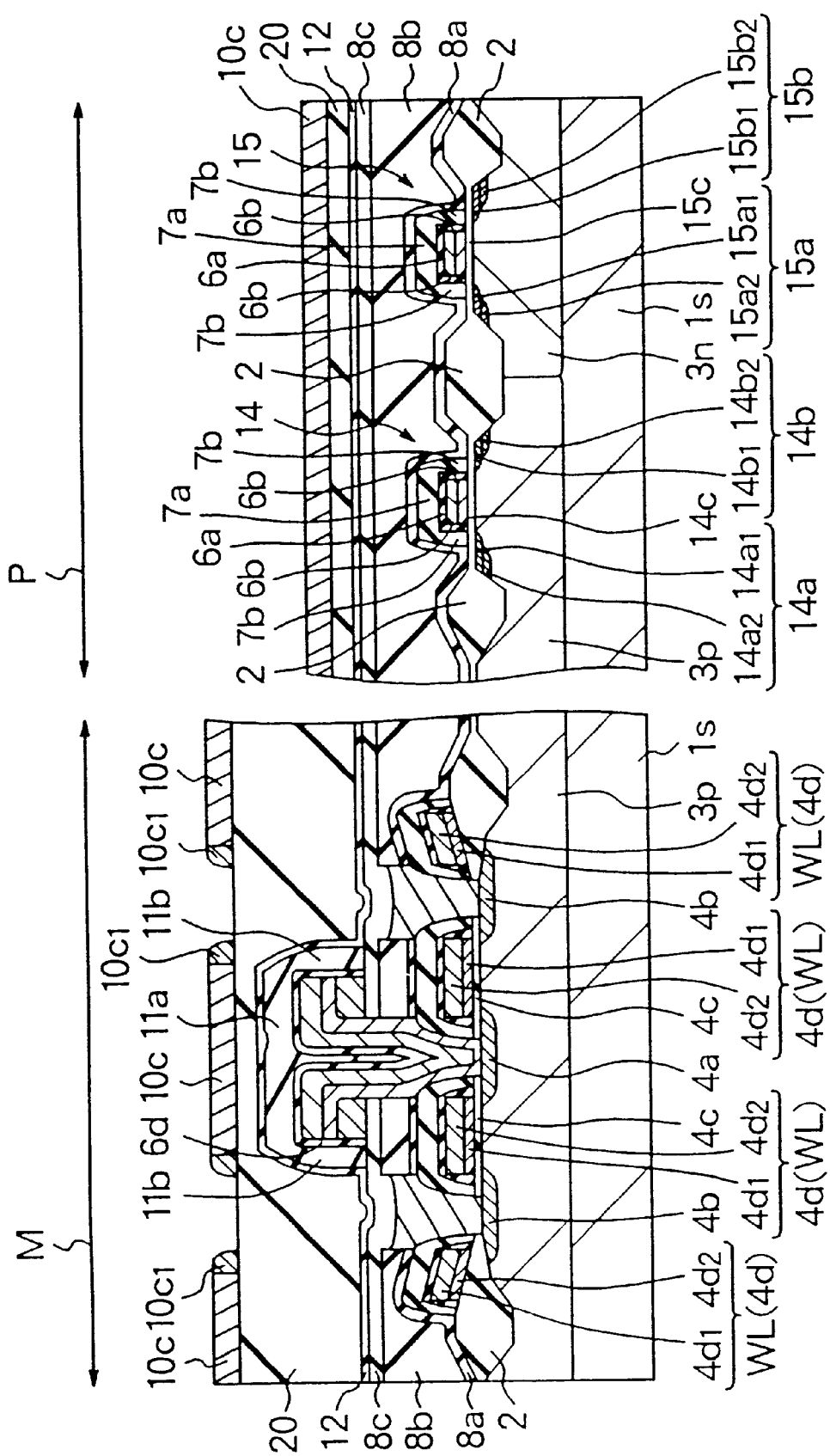

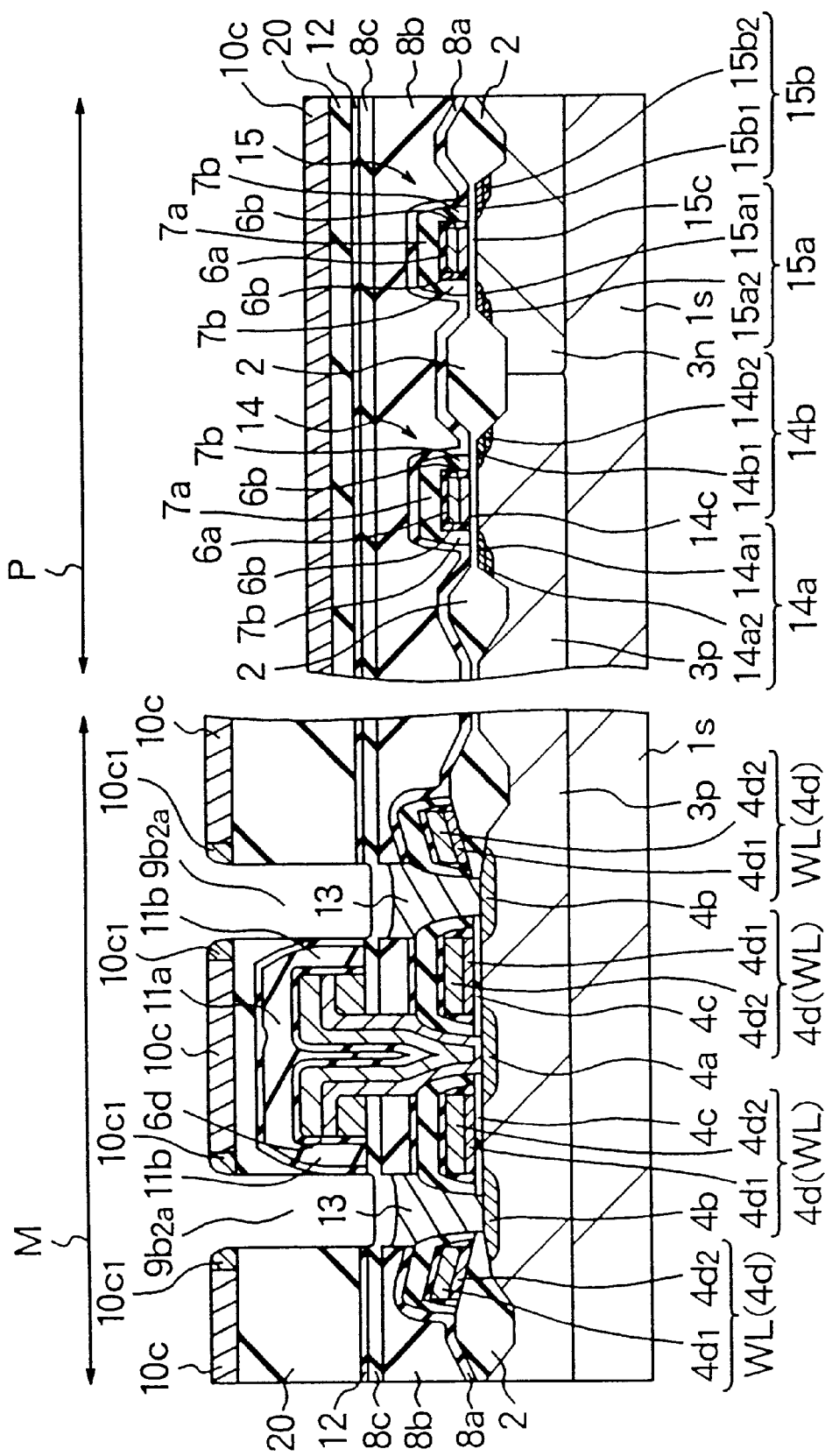

FIG. 5u1
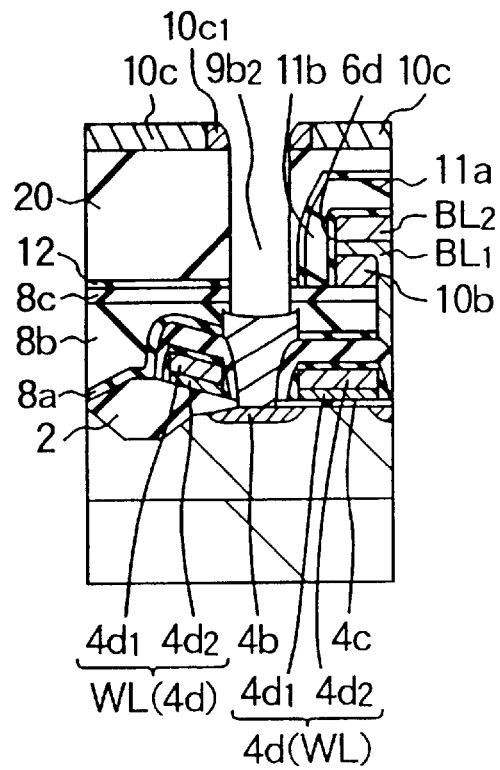
FIG. 5u2
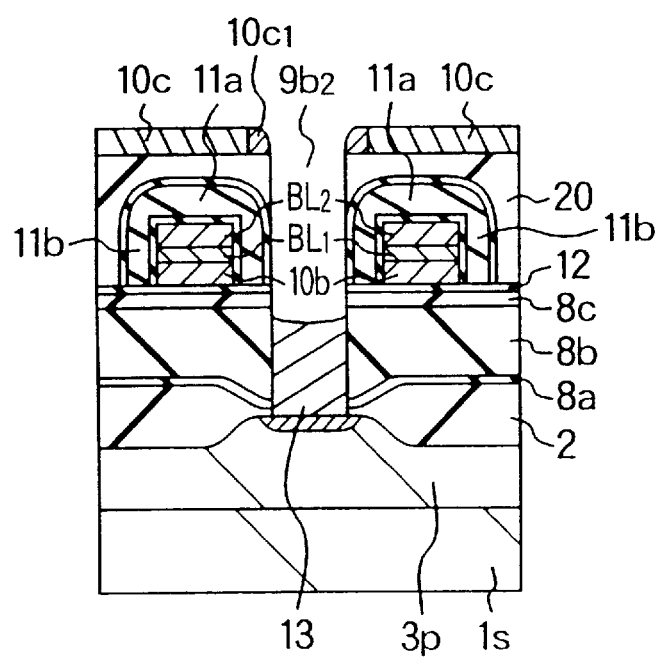

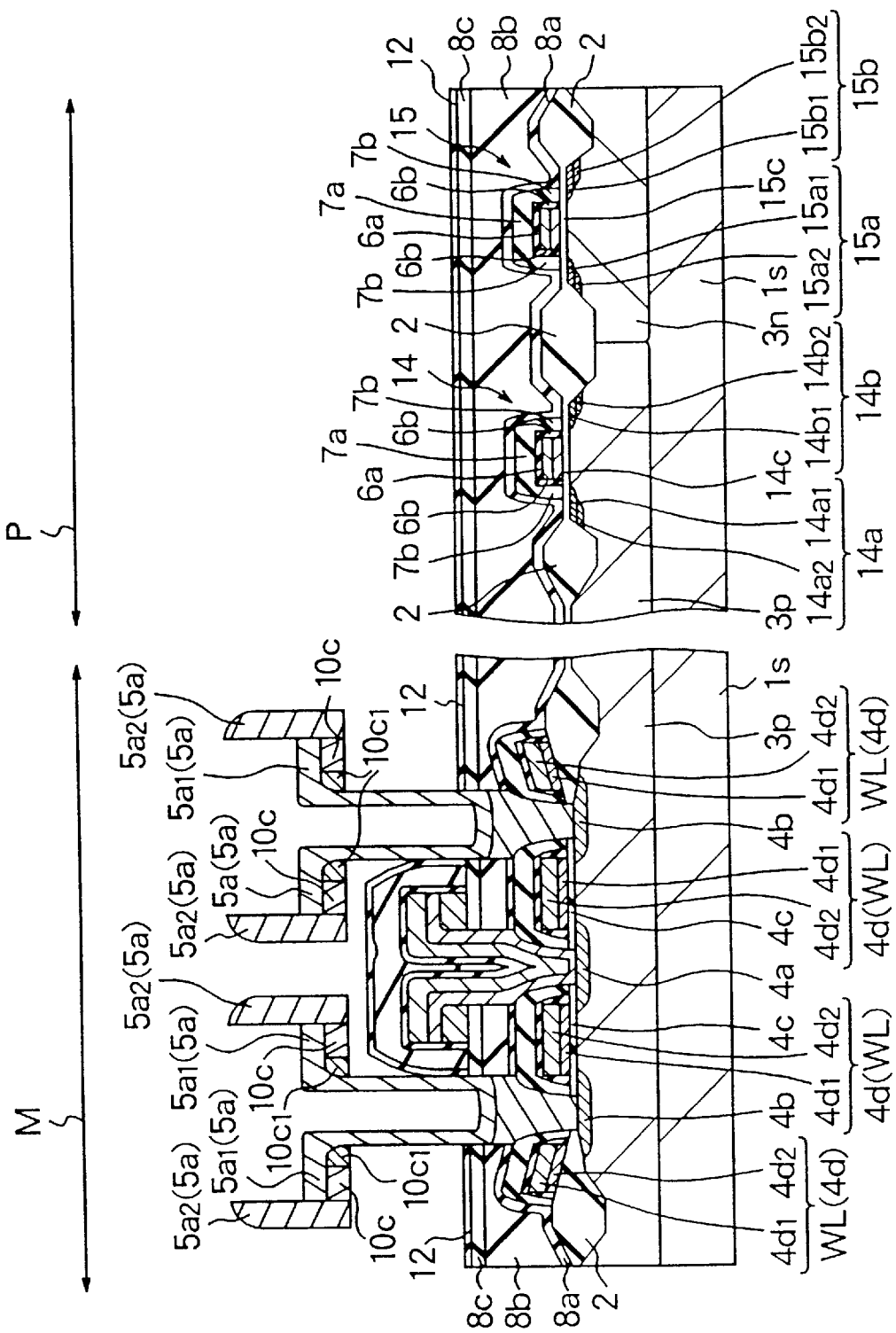

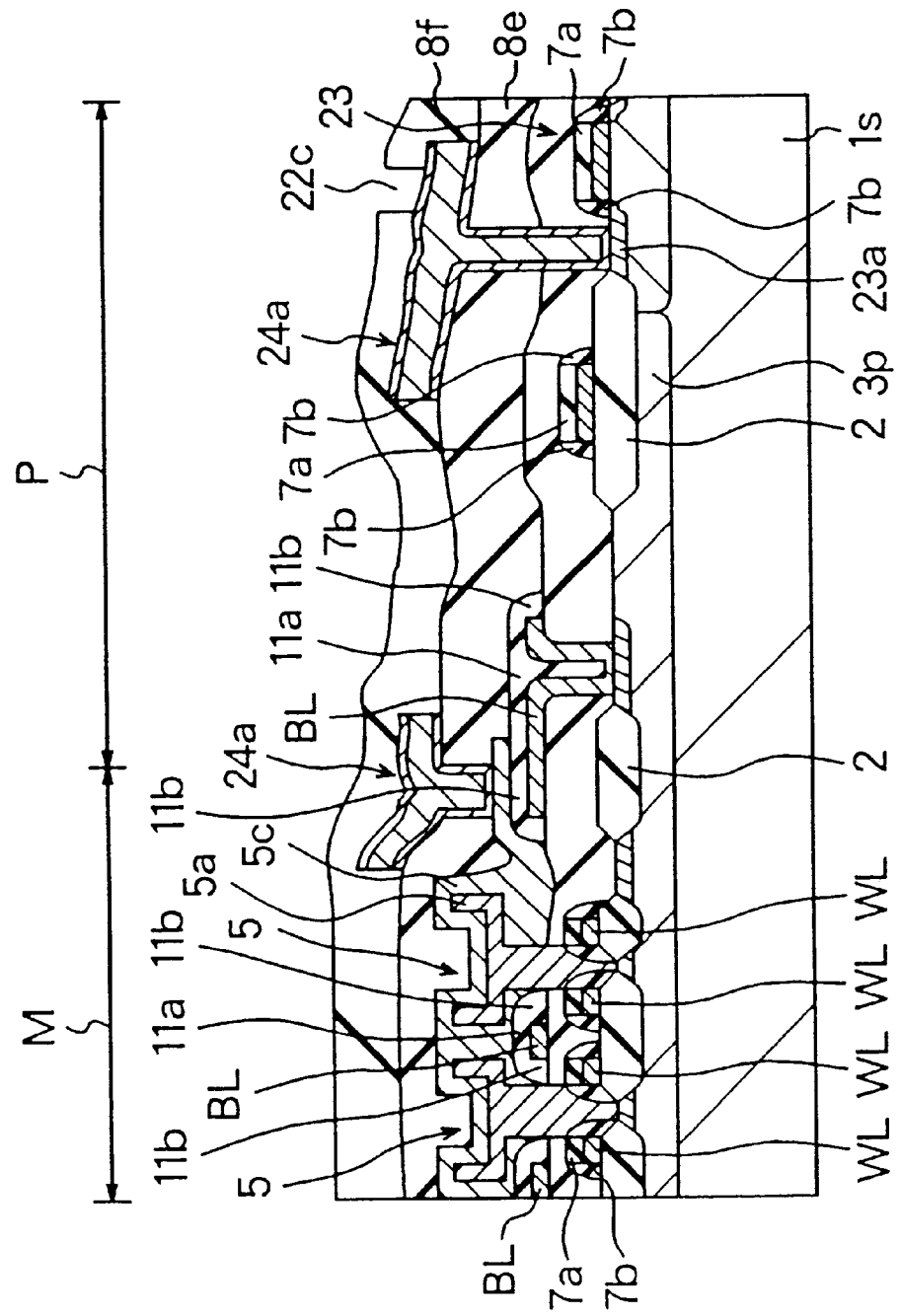

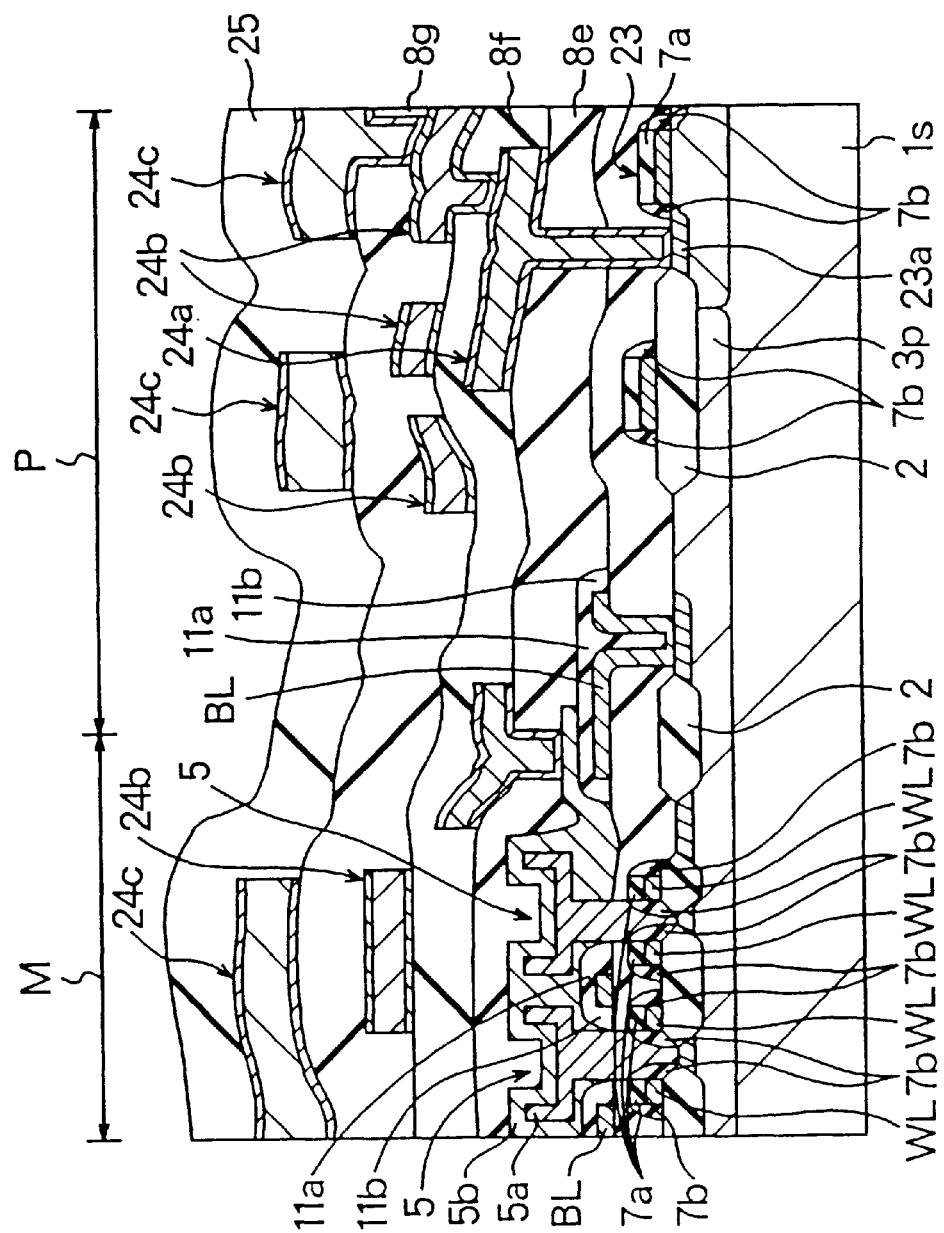

FIG. 9a

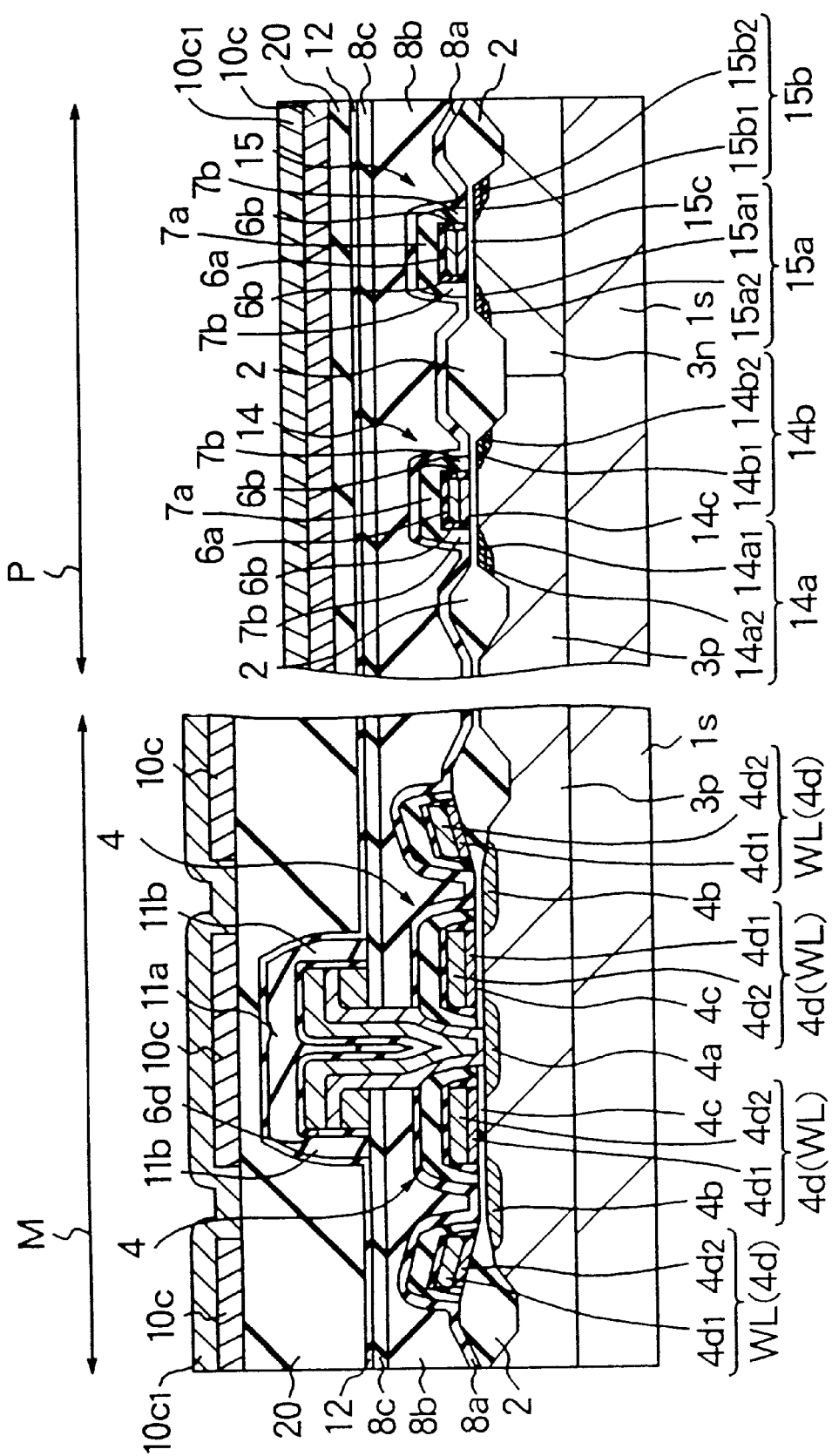

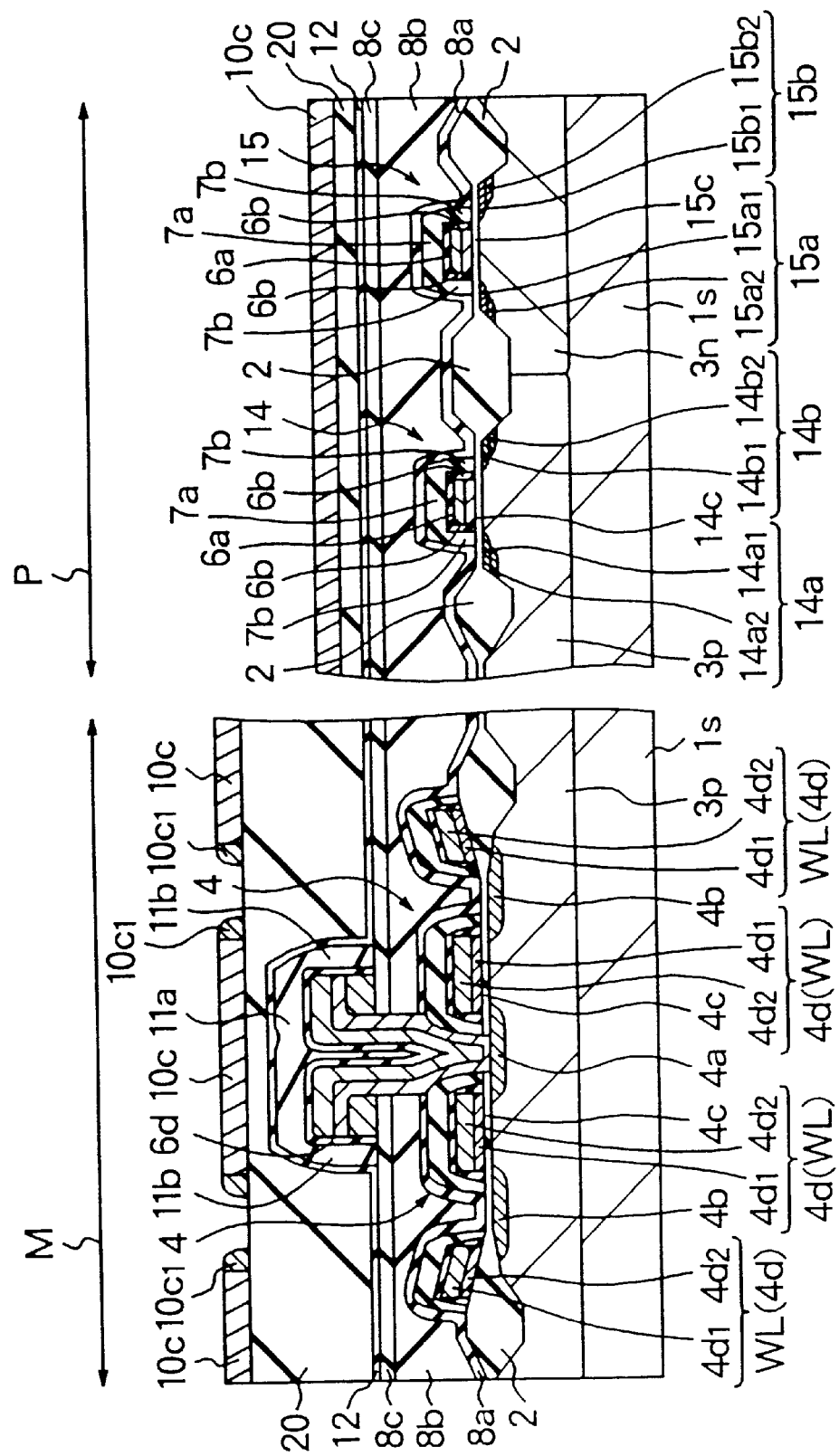

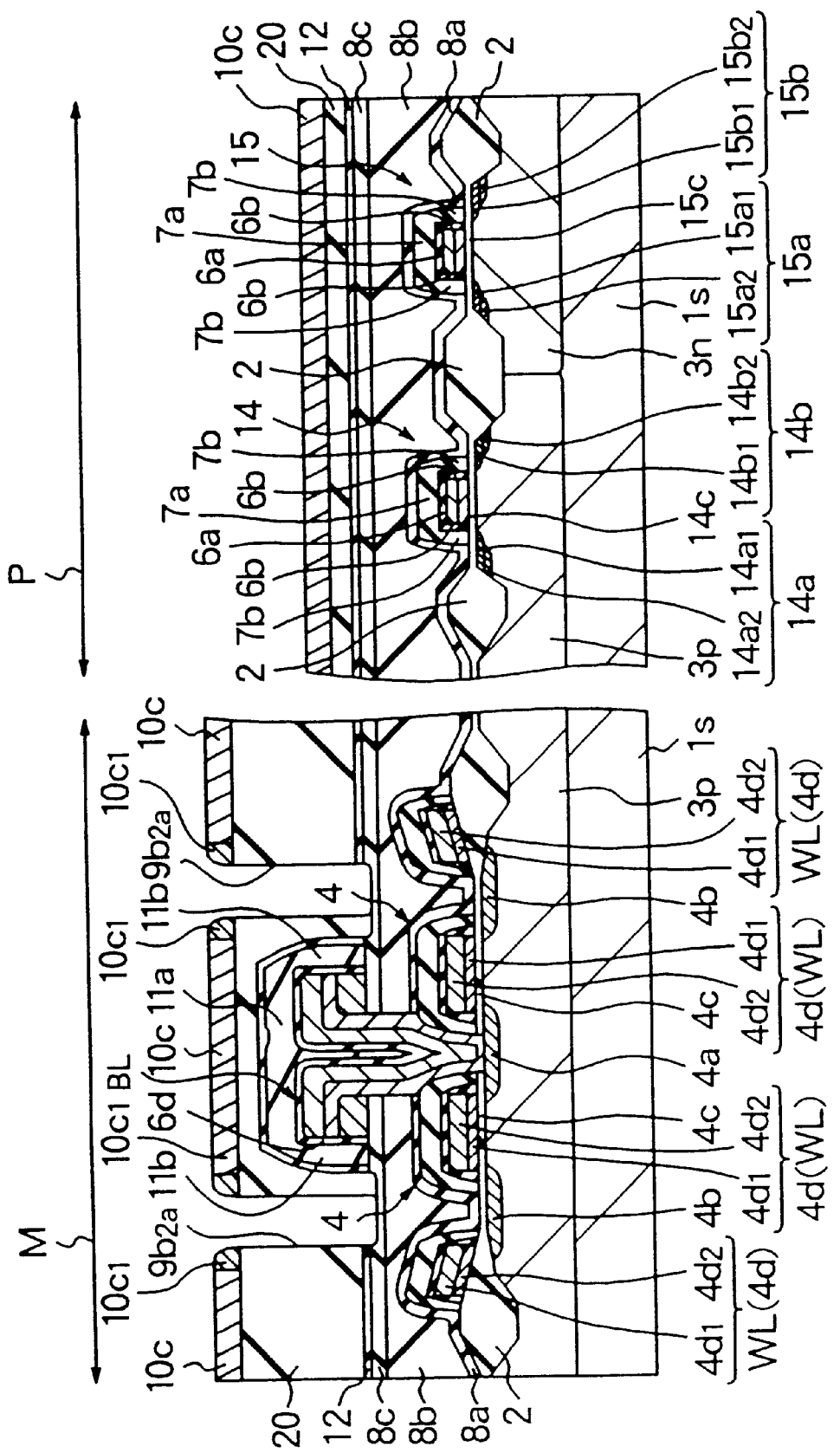

METHOD OF MANUFACTURING SEMICONDUCTOR INTEGRATED CIRCUIT DEVICES HAVING A MEMORY DEVICE WITH A REDUCED BIT LINE STRAY CAPACITY AND SUCH SEMICONDUCTOR INTEGRATED CIRCUIT DEVICES

This application is a Divisional application of application Ser. No. 08/862,320, filed May 23, 1997, now abandoned the contents of which are incorporated herein by reference in their entirety.

BACKGROUND OF THE INVENTION

The present invention relates to semiconductor integrated circuit devices, and in particular to semiconductor integrated circuit devices having DRAMs (Dynamic Random Access Memories) and a method of manufacturing them.

A semiconductor integrated circuit device having a DRAM is described, for example, in Japanese Patent Application No. 7-208037 filed in the name of the assignee of the present application on Aug. 15, 1995, in which a DRAM is disclosed having a so-called capacitor-over-bit line structure, i.e., having a structure such that memory cell capacitors are provided over bit lines.

In that technique, cap insulating films and side walls covering word lines and bit lines are made of a silicon nitride so that capacitor contact holes through which capacitors and semiconductor regions of memory cell selection MOS FETs are connected and bit line contact holes through which bit lines and semiconductor regions of memory cell selection MOS FETs are connected can be formed in self-alignment to thereby improve the accuracy of alignment of the contact holes and reduce the contact hole diameters with a result that the memory cell size can be decreased.

Meanwhile, in the recent years, it is more and more expected for DRAMs to have device elements highly integrated with fine patterning process margin sufficiently preserved and to have enhanced performance characteristics. To this end, it is now considered essential to form capacitor contact holes and bit line contact holes in self-alignment for reduction of memory cell size and how to effectively reduce unnecessary stray capacity accompanying the bit lines.

The present invention relates to the subject matter of U.S. patent application Ser. No. 08/694,766 filed on Aug. 9, 1996 (corresponding to Korean Patent Application No. 33,141/96 filed on Aug. 9, 1996 and to Taiwanese Patent Application No. 84109019 filed on Aug. 29, 1995), the whole of the disclosure of which is herein incorporated by reference. That application corresponds to the above-mentioned Japanse Patent Application No. 7-208037.

SUMMARY OF THE INVENTION

An object of the present invention is to provide a technique for reducing the bit line stray capacity in a semiconductor integrated circuit device having a memory device.

Another object of the present invention is to provide a technique for alleviating alignment accuracy requirement for capacitor contact holes and bit line contact holes for memory cell size reduction and for reducing bit line stray capacity.

According to one aspect of the present invention, in a semiconductor integrated circuit device with a memory device, the memory device including first conductors each having its upper and side surfaces covered with a first insulating film, second conductors provided so as to be transverse to and insulated from the first conductors and covered with a second insulating film, and a plurality of memory cells each provided at one of intersections between the first and second conductors and having a capacitor and a memory cell selection transistor, contact holes for connecting semiconductor regions of the transistors and the capacitors and contact holes for connecting bit lines and semiconductor regions of the transistors are formed in self-alingment, and the second insulating film has a permittivity smaller than that of the first insulating film.

The second insulating film may be made of a material having a permittivity substantially equal to that of the first insulating film. In that case, the second insulating film should be formed to a thickness larger than the first insulating film.

BRIEF DESCRIPTION OF THE DRAWINGS

FIGS. 5a to 5y and 6a to 6d are sectional views of a main part of a semiconductor integrated circuit device at respective stages of a method of manufacturing the device according to one embodiment of the present invention.

FIGS. 9a to 9f are sectional views of a main part of a semiconductor integrated circuit device at respective stages of a method of manufacturing the device according to one embodiment of the present invention.

DESCRITION OF THE PREFERRED EMBODIMENTS

Various embodiments of the present invention will now be described with reference to the accompanying drawings. Throughout the drawings showing the embodiments, members having similar functions are denoted by same reference symbols, and description of such similar members will not be repeated.

(Embodiment 1)

Figure 1:
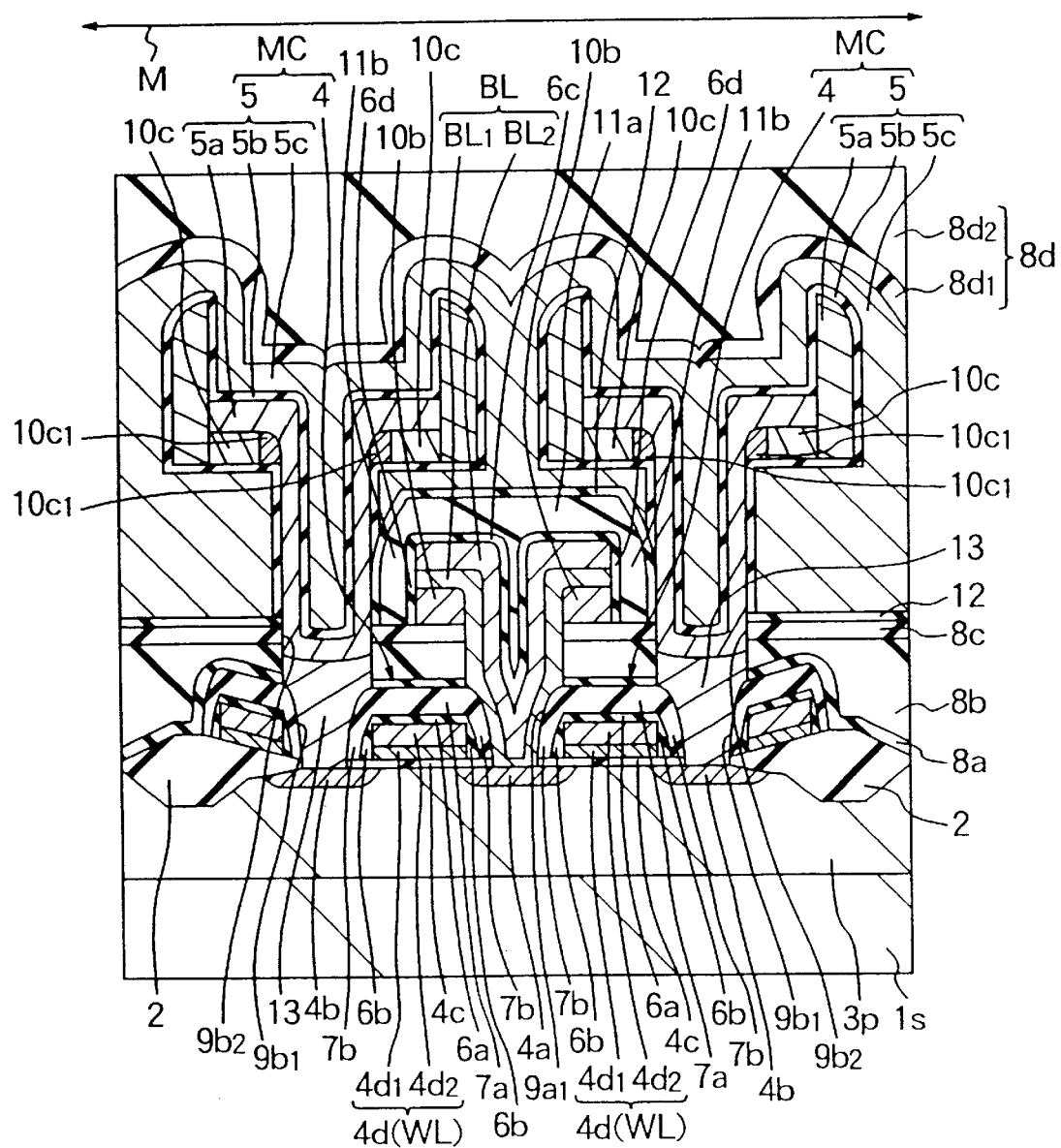
FIG. 1 is a sectional view of a main part of a memory cell region of a memeory device included in a semiconductor integrated circuit device according to one embodiment of the present invention.
Figure 2:
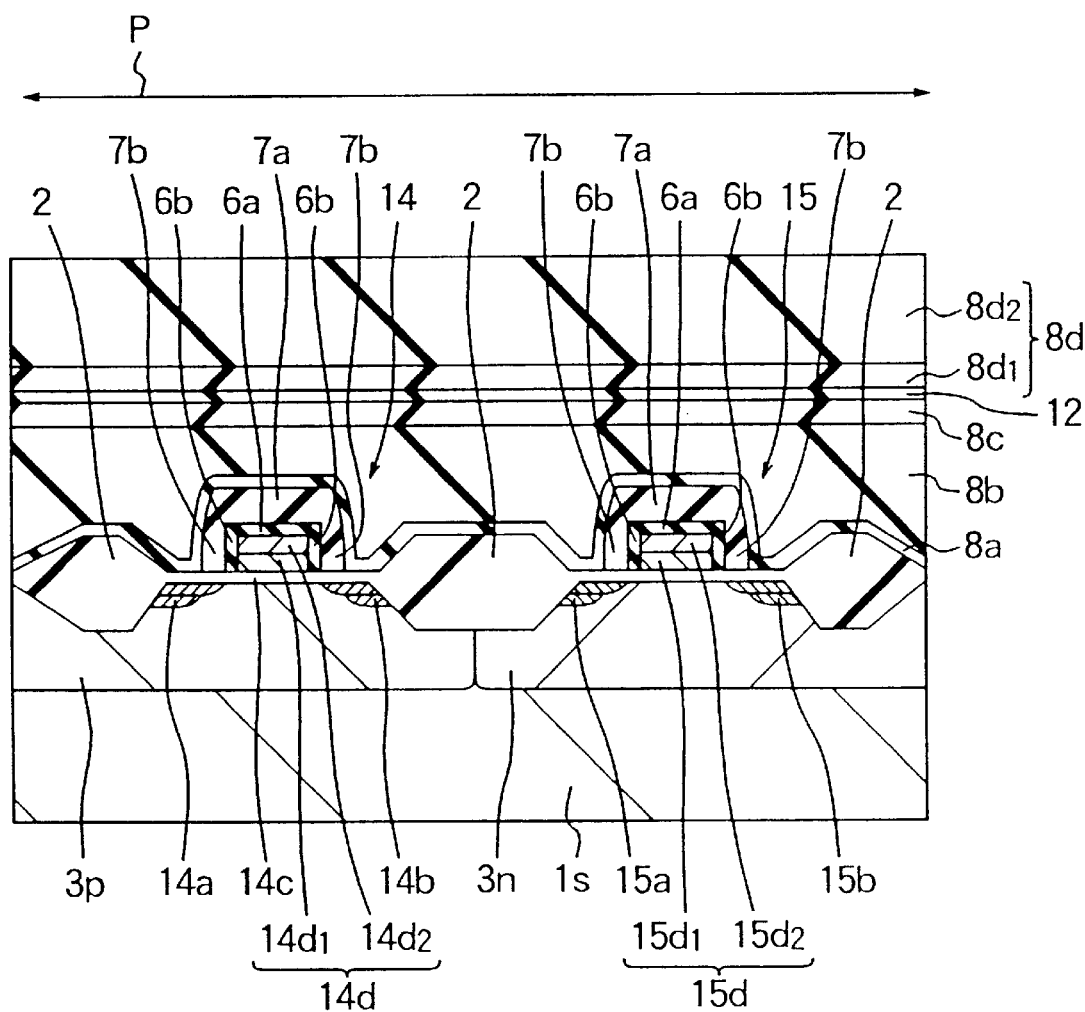
FIG. 2 is a sectional view of of a main part of a peripheral circuit region of the memory device shown in FIG. 1.
Figure 3:
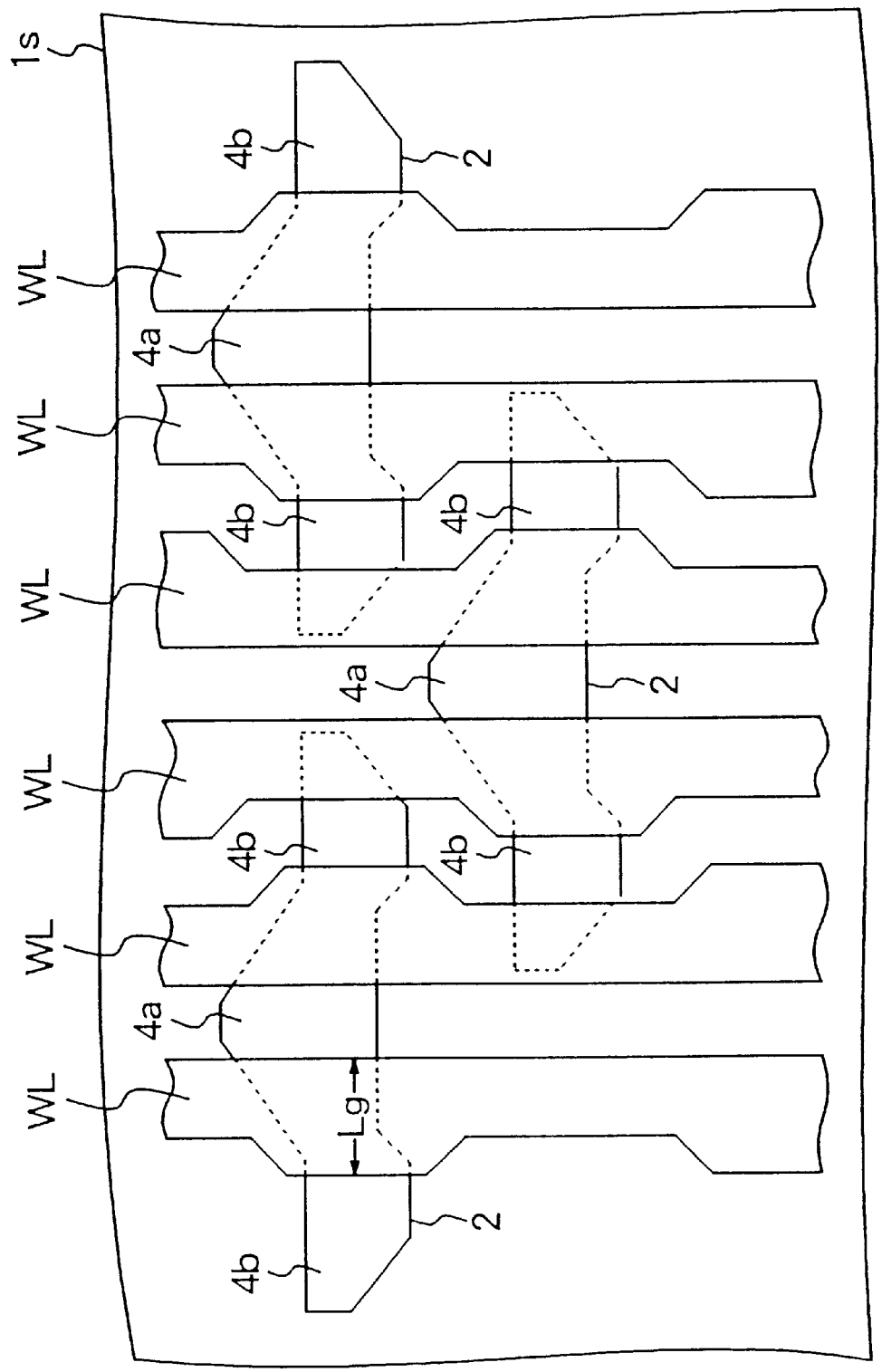
FIG. 3 is a plan view of a main part of the memory cell region of the memory device shown in FIG. 1.
Figure 4:
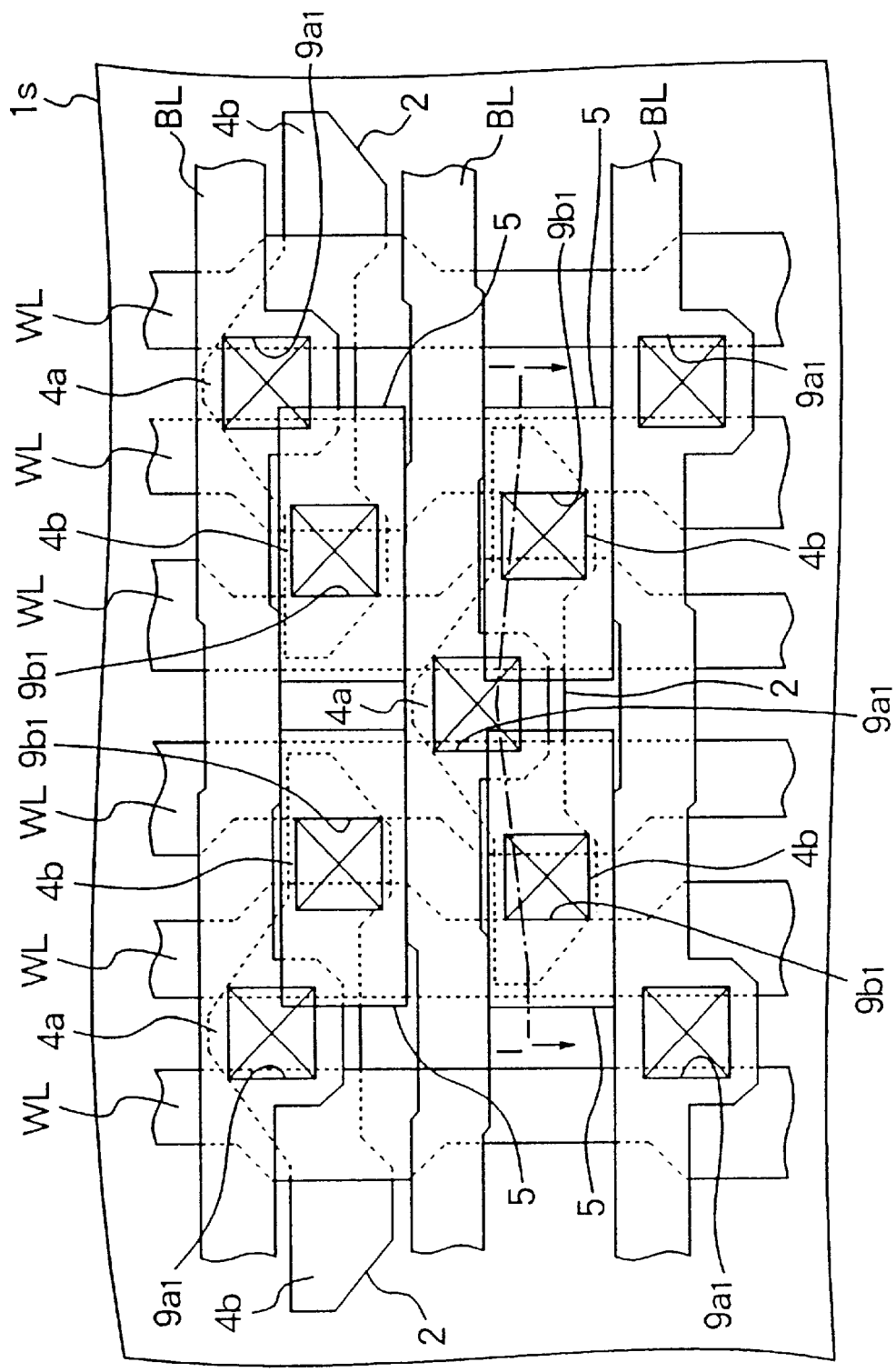
FIG. 4 is another plan view of a main part of the memory cell region of the memory device shown in FIG. 1.
Figure 5F:
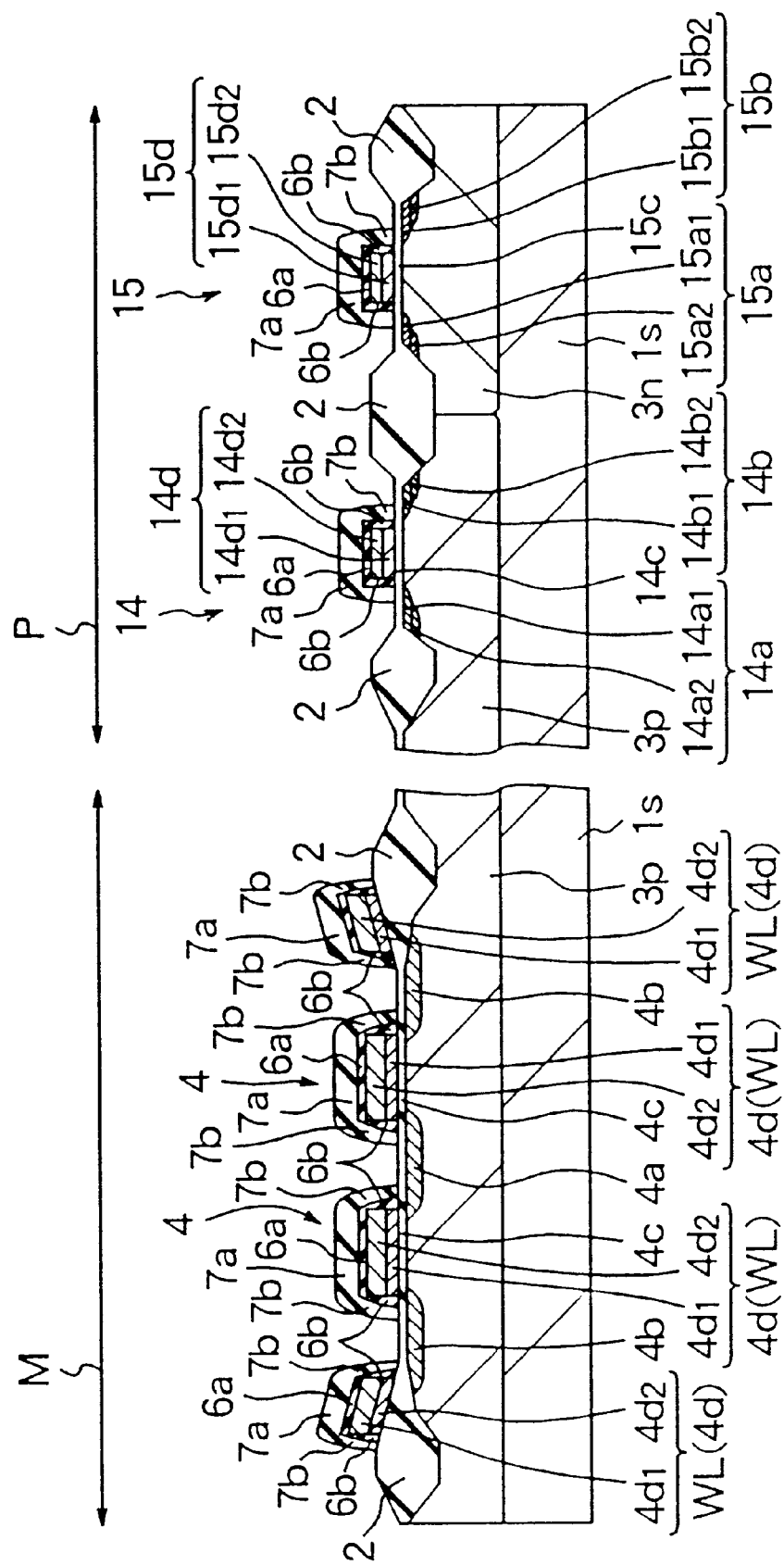
Figure 5G:
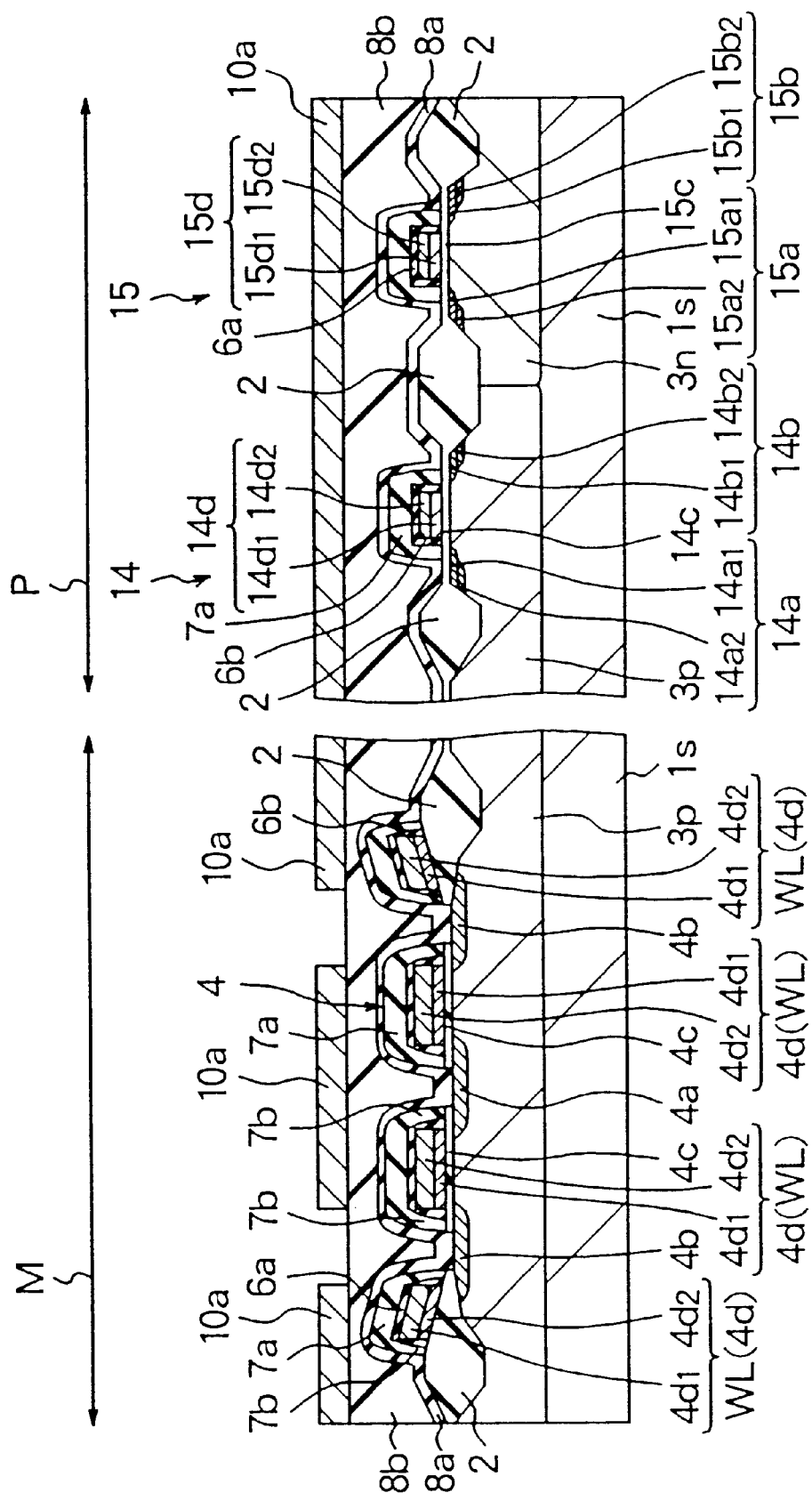
Figure 5H:
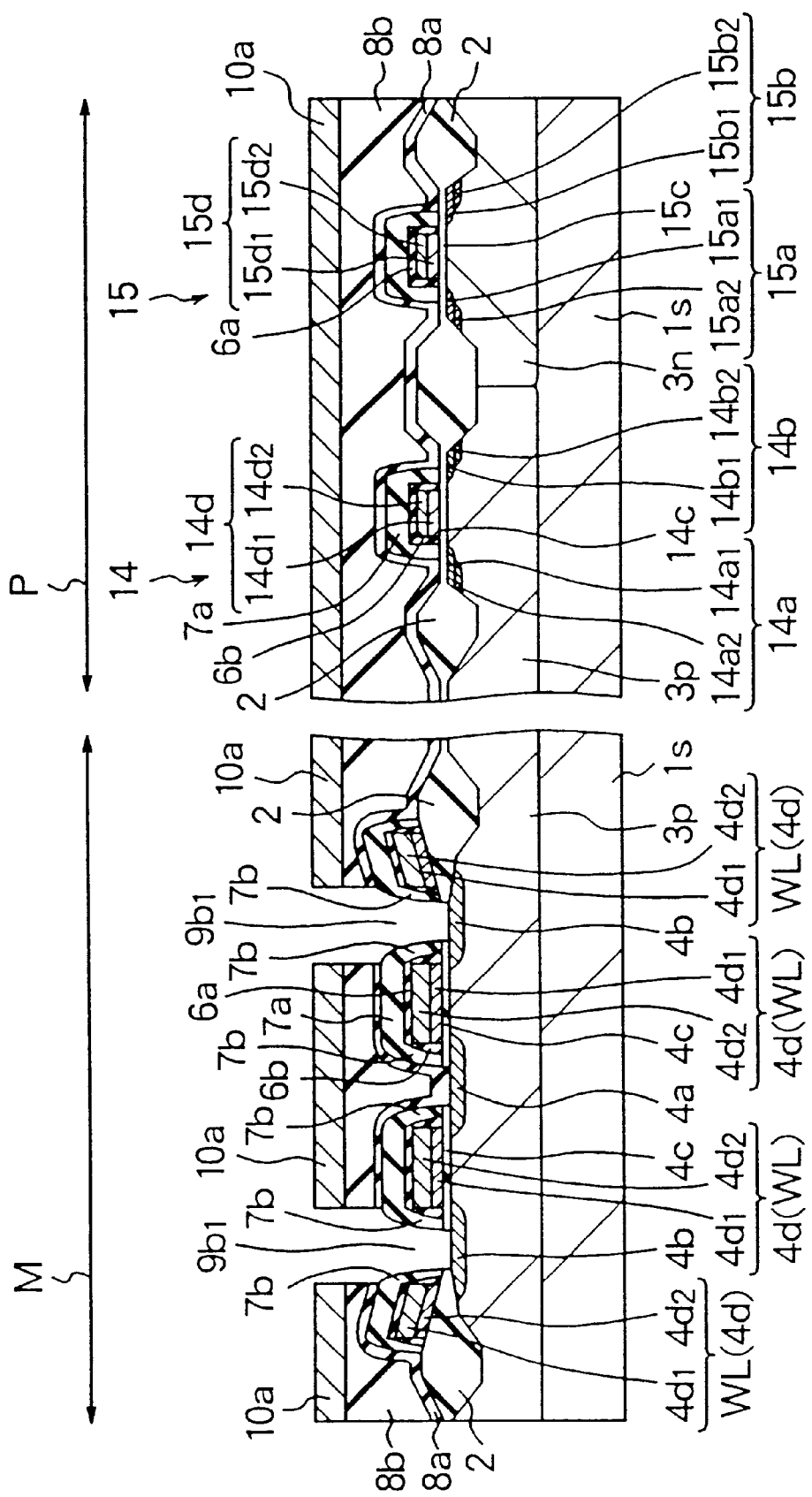
Figure 5J:
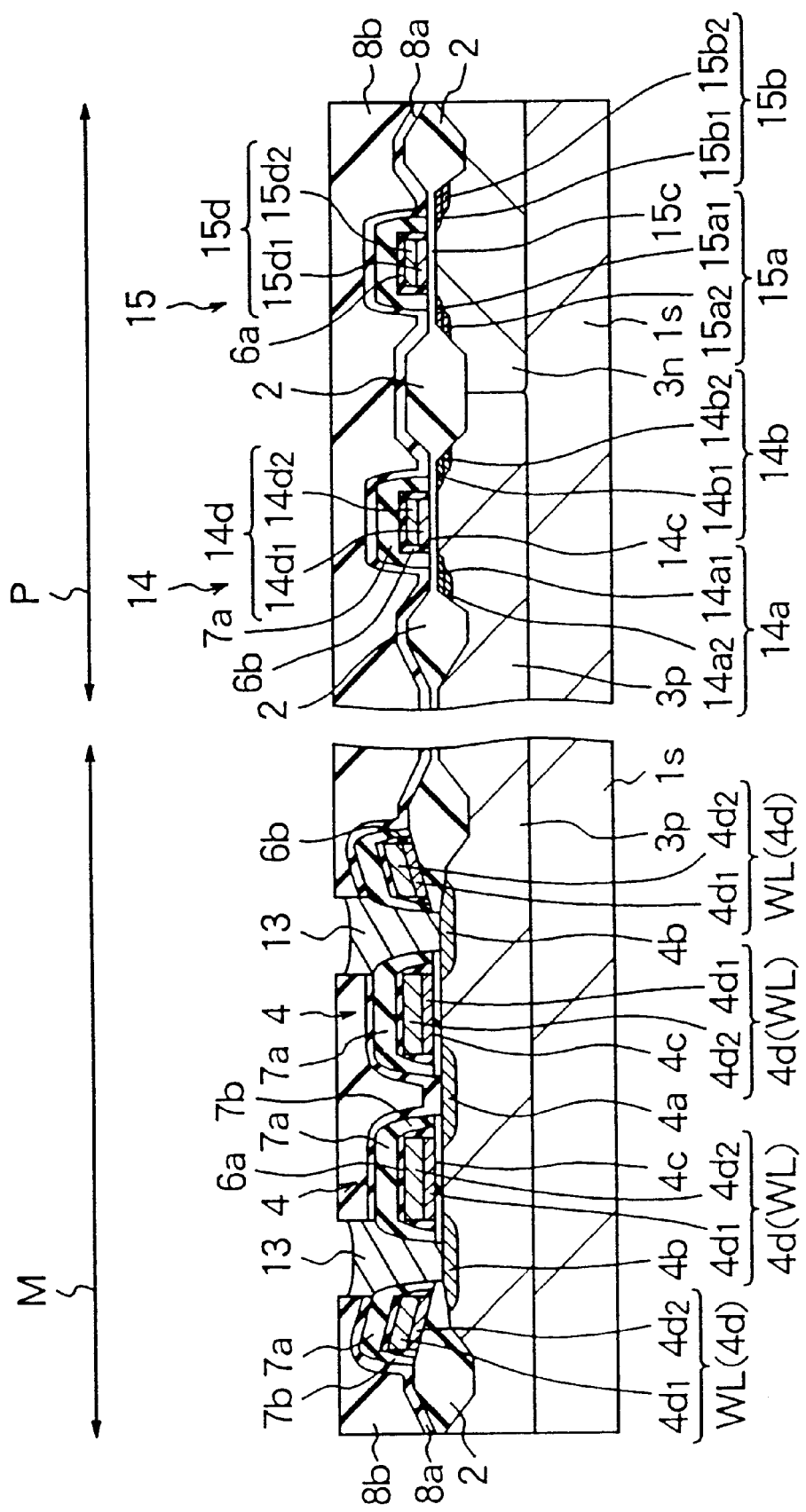
Figure 51:
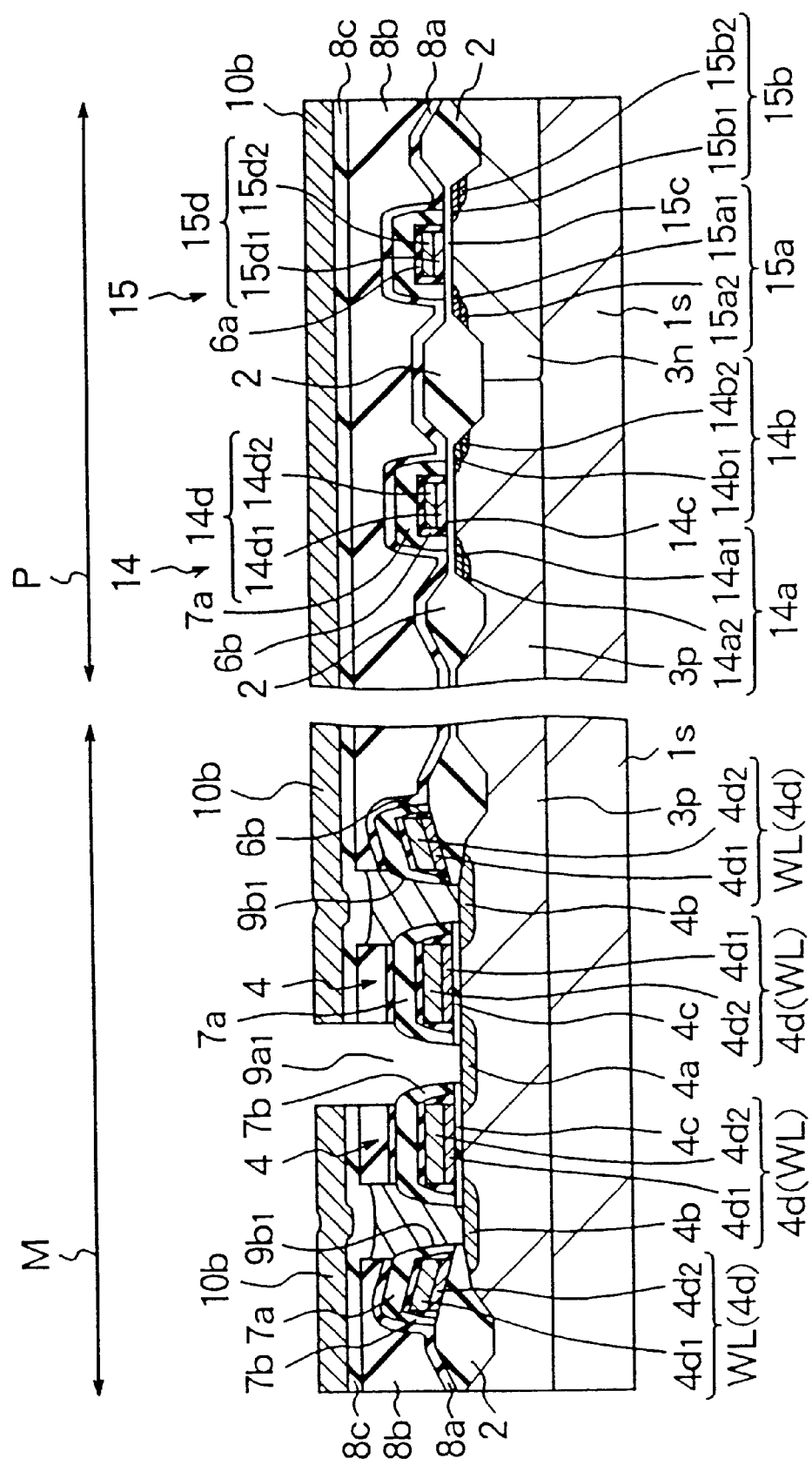
Figure 5M:
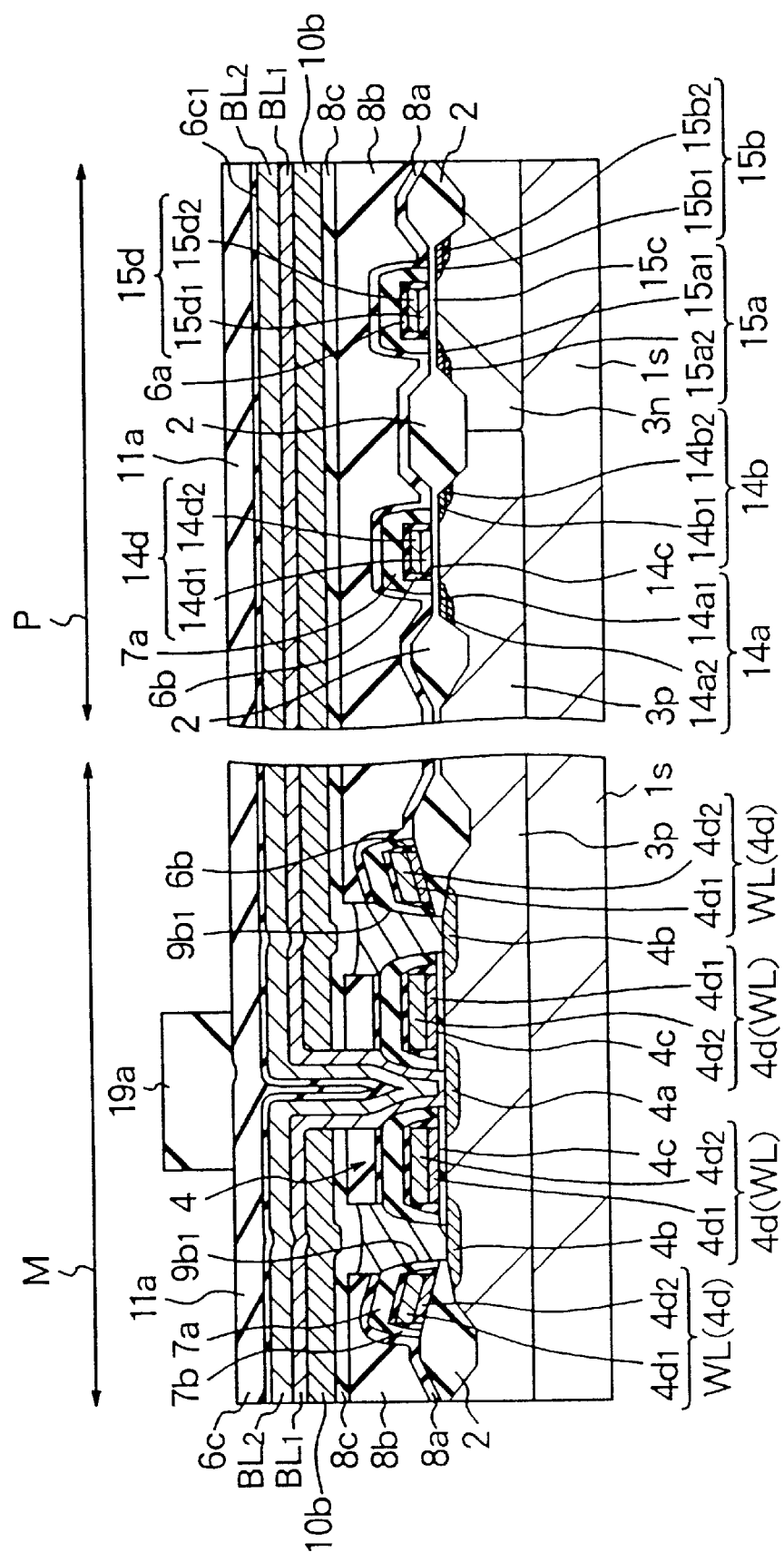
Figure 5N:
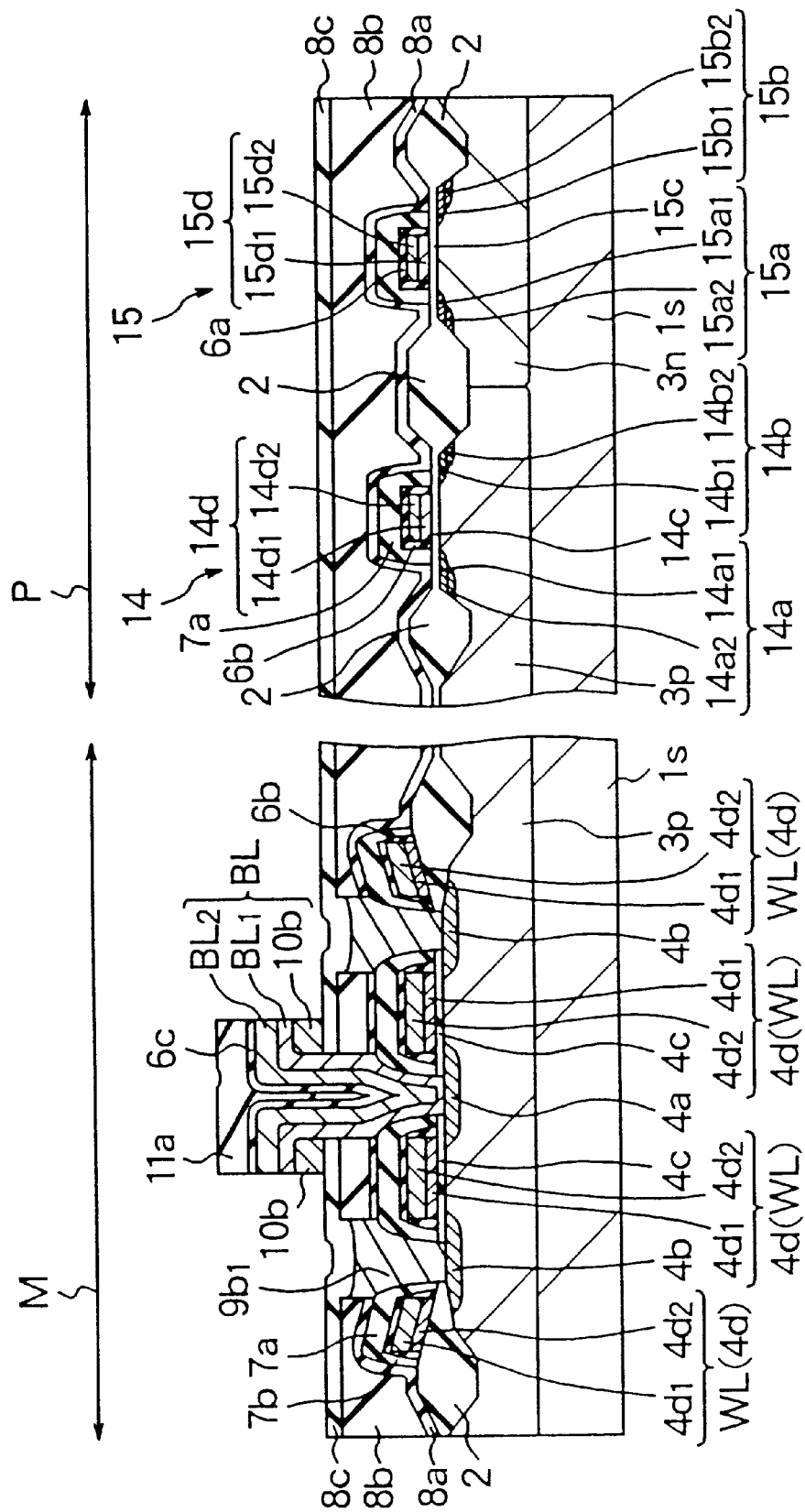
Figure 5O:
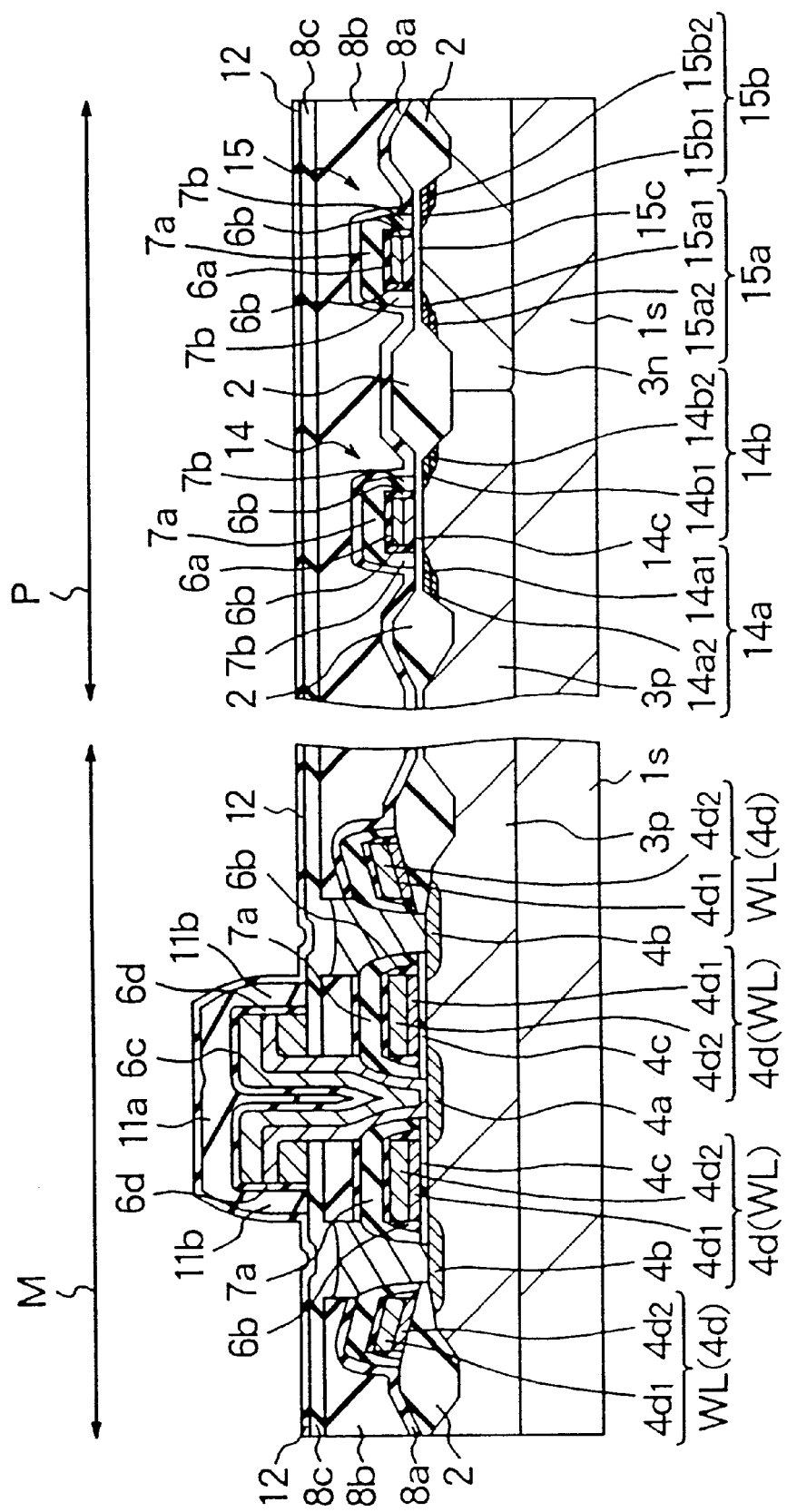
Figure 5P:
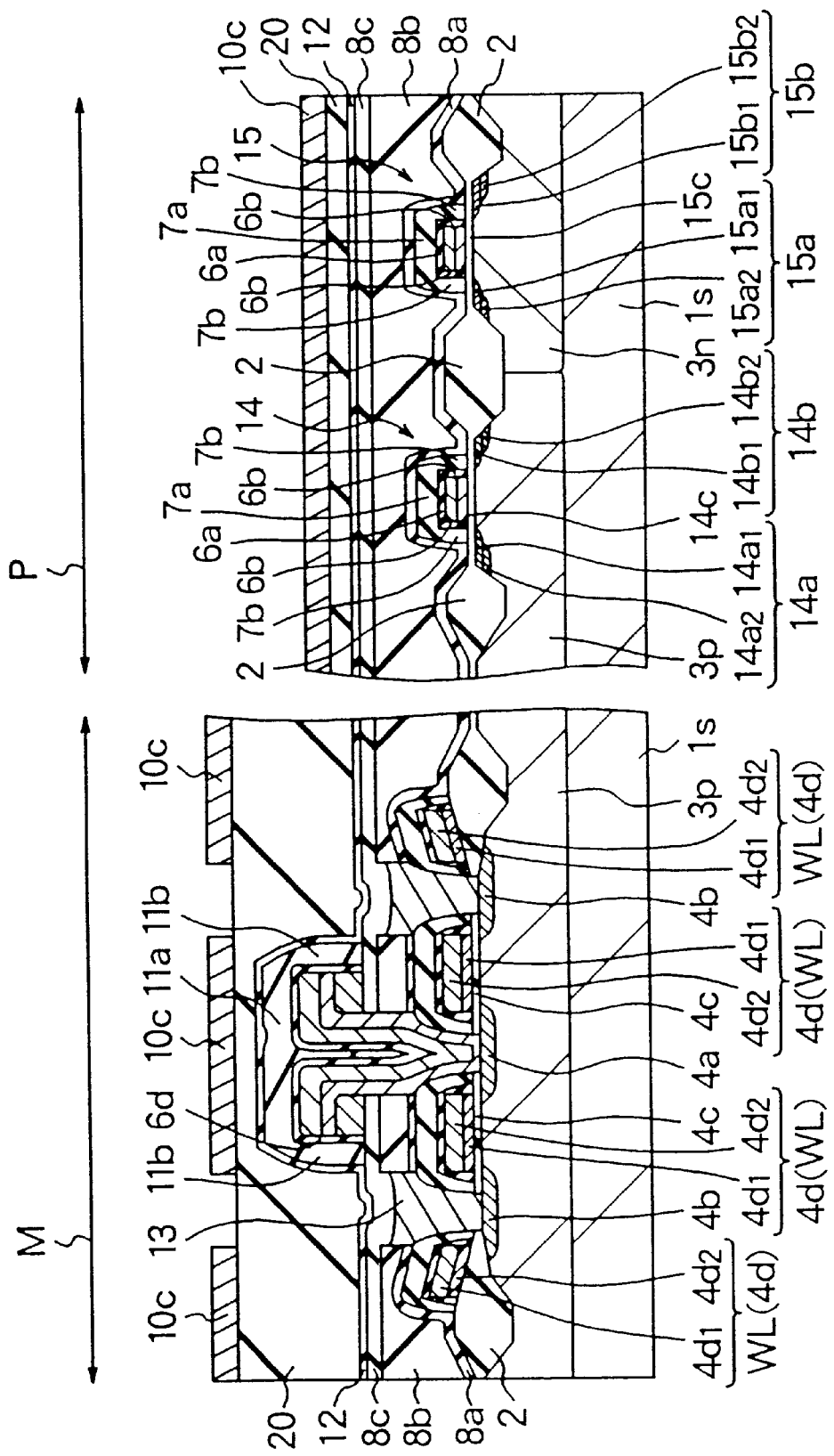
Figure 5T:
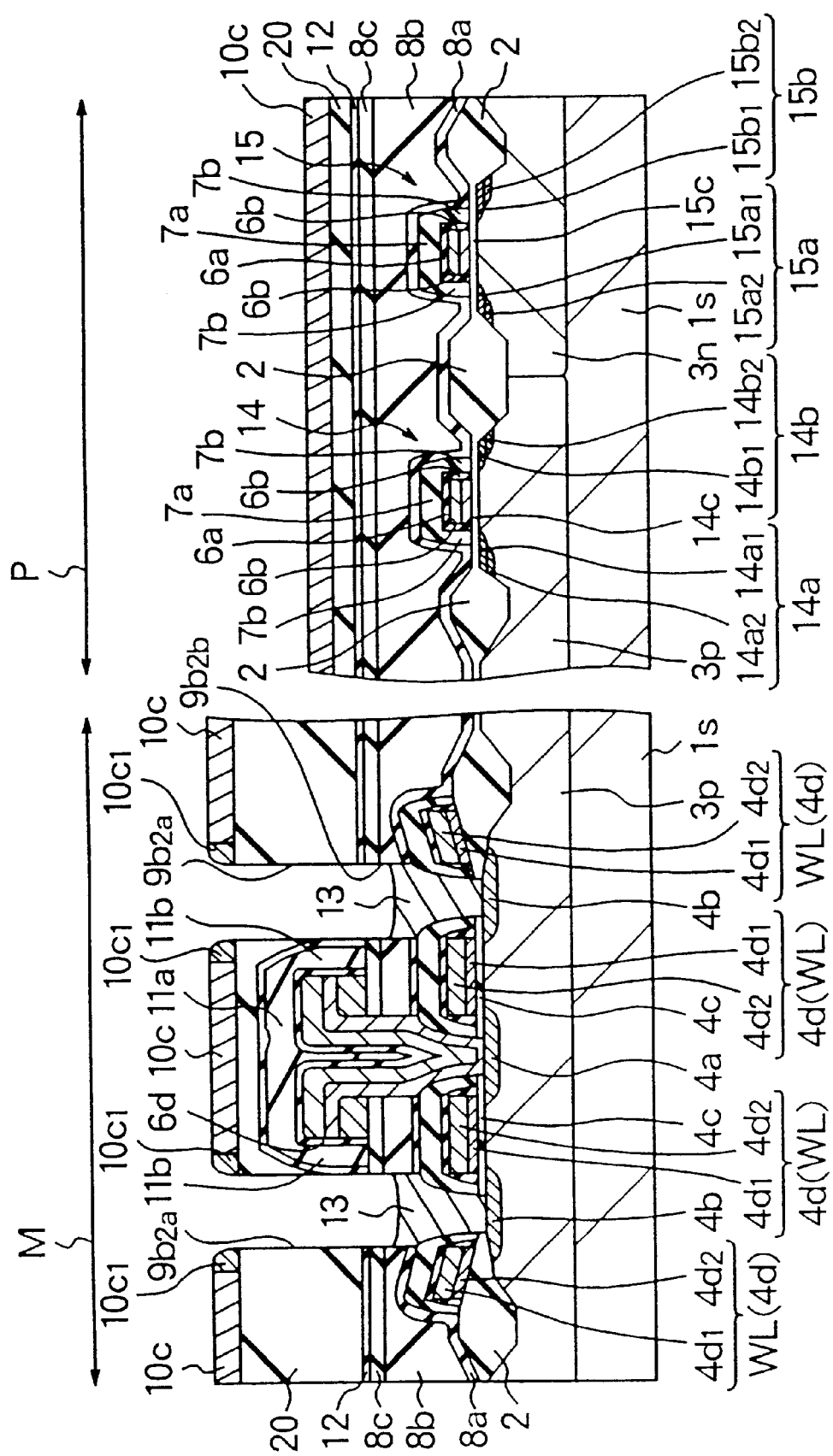
Figure 5Y:
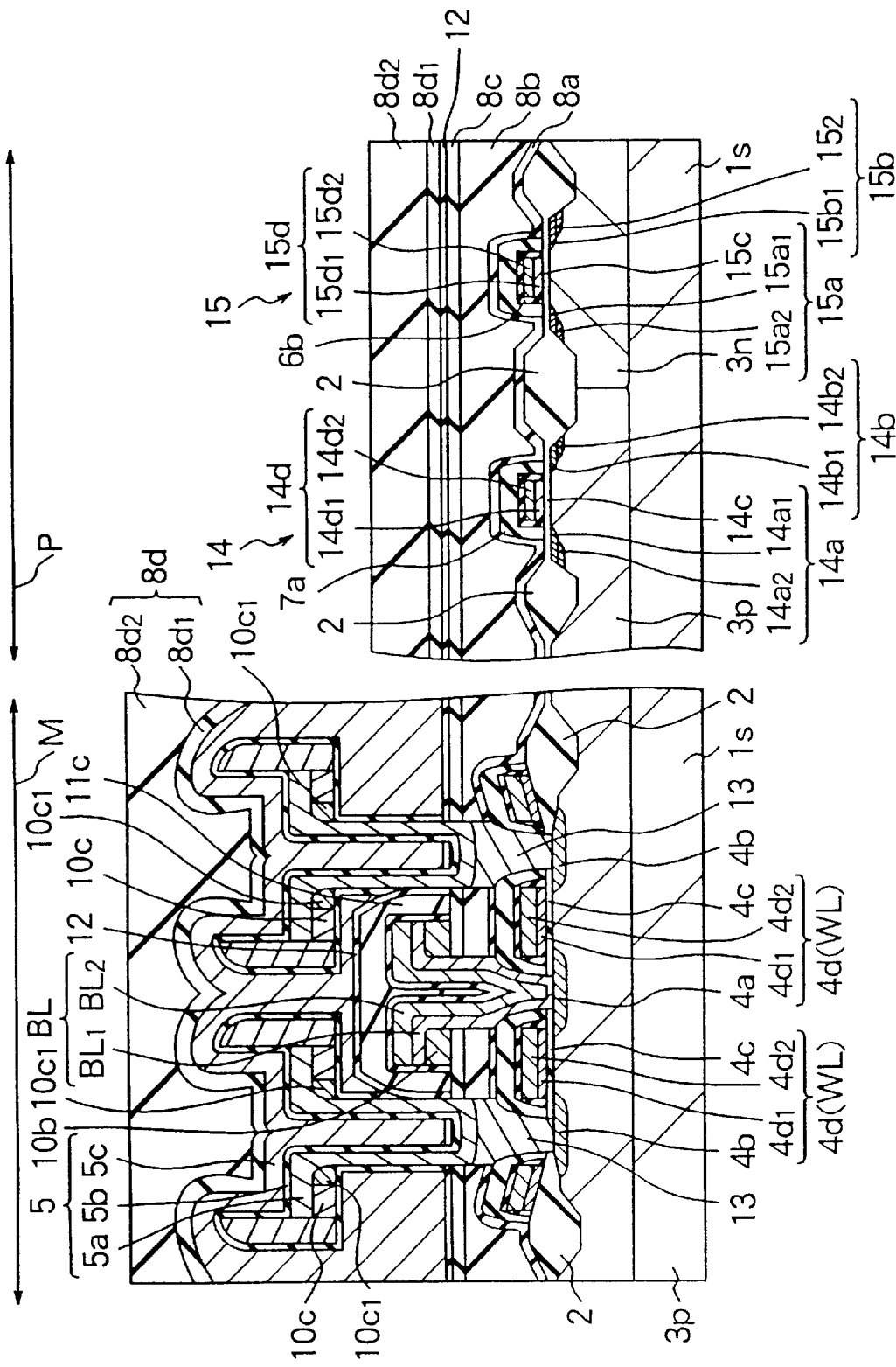
Figure 6A:
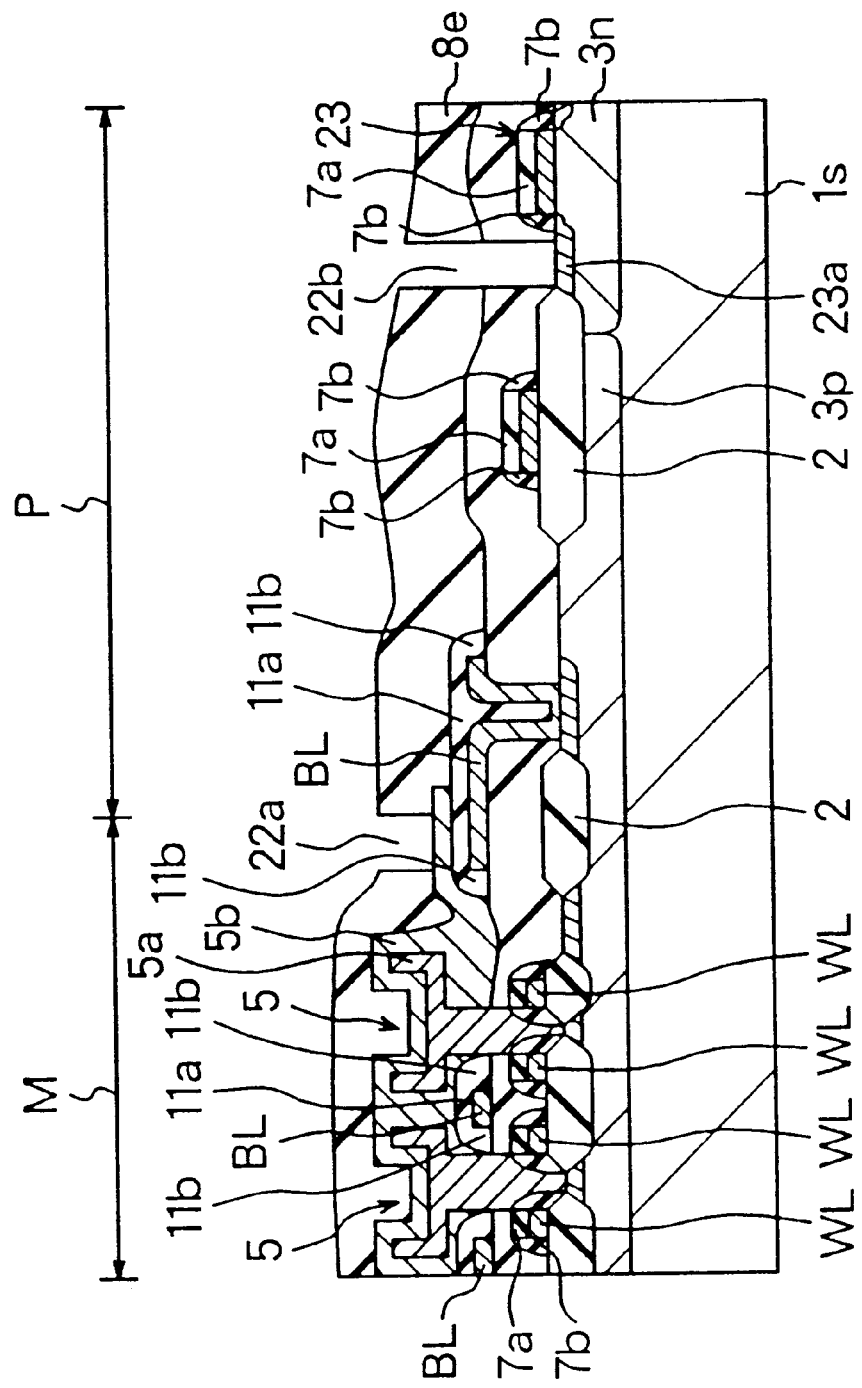
Figure 6C:
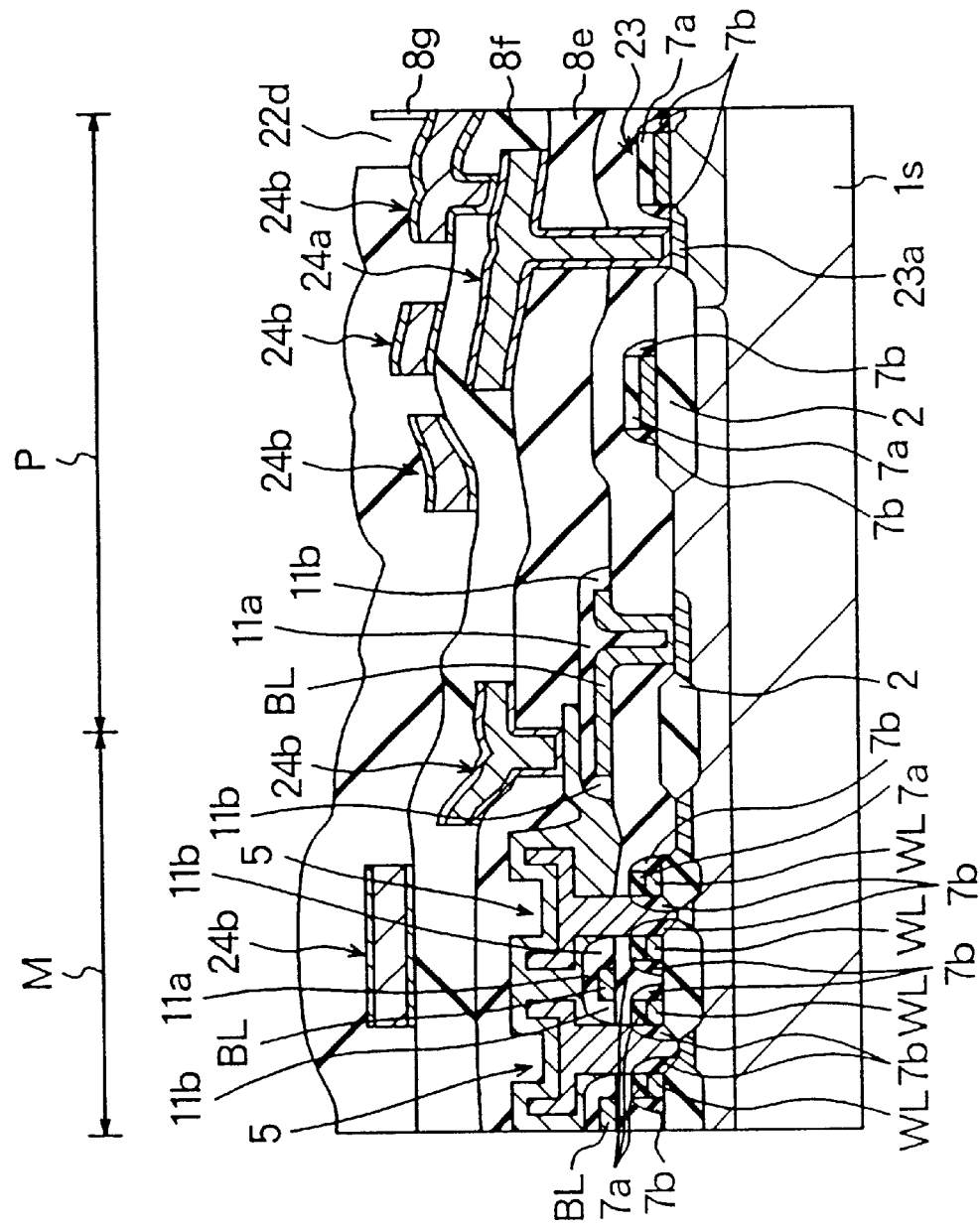
Figure 7:
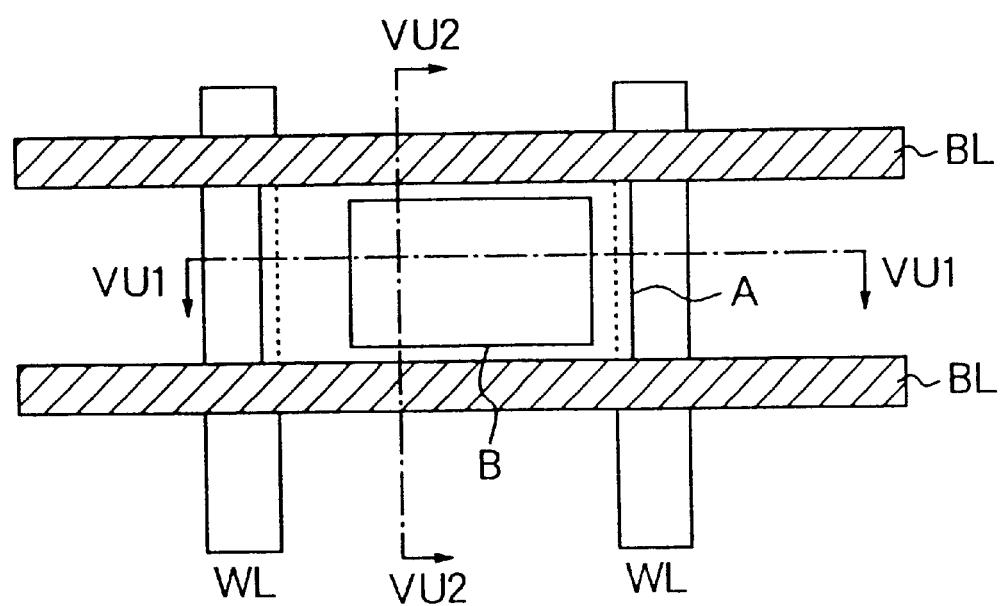
FIG. 7 is a plan view of the device at the manufacturing stage shown in FIG. 5t.

FIG. 1 is a sectional view of a main part of a memory cell region included in a semiconductor integrated circuit device according to an embodiment of the present invention, FIG. 2 is a sectional view of a main part of a peripheral circuit region for the memory cell region shown in FIG. 1, FIG. 3 is a plan view of a main part of the memory cell region shown in FIG. 1, FIG. 4 is another plan view of a main part of the memory cell region shown in FIG. 1, FIGS. 5a to 5y and 6a to 6d are sectional views illustrating a method of manufacturing a semiconductor integrated circuit device according to an embodiment of the present invention, and FIG. 7 is a plan view of the semiconductor integrated circuit device shown in FIG. 5t.

The semiconductor integrated circuit device according to the present first embodiment may include, for example, a 64

Mbit DRAM. However, the present invention is not limited to application to 64 Mbit DRAMs, but it is applicable to various semiconductor devices.

The DRAM will now be described by referring to FIGS. 1 through 4. FIG. 1 is a sectional view taken along line I—I illustrated in FIG. 4.

A semiconductor substrate 1s included in the DRAM is, for example, made of a silicon (Si) single crystal of p-type. On the semiconductor substrate 1s, an isolating field insulating film 2 made of, for example, silicon dioxide ($SiO_2$) is formed.

In a main surface of the semiconductor substrate 1s in a memory cell region M, a p-well 3p is formed. In the p-well 3p, boron, for example, has been introduced as a p-type impurity. On the p-well 3p, a memory cell MC is formed. The memory cell MC includes one memory cell selection MOSFET (hereafter referred to as selection MOS) 4 and one capacitor 5. The size of the one memory cell is, for example, approximately 1.0–2.0 $\mu m^2$.

The selection MOS 4 has one pair of semiconductor regions 4a and 4b formed on the resulting semiconductor substrate 1s so as to be spaced apart from each other, a gate insulating film 4c formed on the resulting semiconductor substrate 1s, and a gate electrode 4d formed on the gate insulating film 4c.

The semiconductor regions 4a and 4b are regions for forming a source region and a drain region of the selection MOS 4. Into the semiconductor regions 4a and 4b, an n-type impurity such as phosphorus or arsenic (As) has been doped. Between the semiconductor regions 4a and 4b, a channel region of the selection MOS 4 is formed.

An active region having the semiconductor regions 4a and 4b and two channel regions is defined by the surrounding field insulating film 2. The plane shape is laterally symmetric with respect to the semiconductor region 4a (see FIG. 3).

The gate insulating film 4c is, for example, made of $SiO_2$. The gate electrode 4d is formed by forming a conductor film 4d2 made of, for example, tungsten silicide ($WSi_2$) on a conductor film 4d1 made of, for example, a low-resistance poly-silicon film. The resistance of the gate electrode 4d is reduced by the conductor film 4d2. The gate electrode 4d may be formed by a single substance film of low-resistance poly-silicon, or it may be formed by a predetermined metal such as tungsten.

The gate electrode 4d is also a part of a word line WL. The word lines WL extend in a direction nearly perpendicular to the direction in which the above described active region extends. Each of the word lines WL has a predetermined width (Lg) necessary to obtain a threshold voltage of the selection MOS 4 (see FIG. 3). The spacing between adjacent word lines WL is approximately 0.5–1.0 $\mu$m, for example.

The areas of portions of word lines WL defined by dimension Lg are wider than the width of the active region at least by an amount corresponding to mask alignment margin during the device manufacturing process.

The upper and side surfaces of each of the gate electrode 4d (word line WL) are covered with a cap insulating film (word line cap insulating film) 7a and side walls (word line side wall insulating films) 7b via insulating films 6a and 6b. The cap insulating film 7a and the side walls 7b are covered with inter-layer insulating films 8a through 8c. The insulating films 7a and 7b are in contact with the inter-layer insulating film 8a. In the inter-layer insulating films 8a through 8c, a contact hole 9a1 is formed so as to expose the semiconductor region 4a located at the surface of the resulting semiconductor substrate 1s. In the inter-layer insulating films 8a and 8b, a contact hole (lower contact hole) 9b1 is formed so as to expose the semiconductor region 4b located at another surface of the resulting semiconductor substrate 1s. The diameter of the contact holes 9a1 and 9b1 is, for example, approximately 0.3–0.4 $\mu$m.

The insulating films 6a and 6b are, for example, made of $SiO_2$ and has a dual function. First, they function to prevent contamination of the inside of a film forming apparatus with a constituent metal element of the conductor film 4d2 when the cap insulating film 7a and side walls 7b are formed therewith. Second, they function to suppress stress applied to the cap insulating film 7a and side wall 7b stemming from thermal expansion coefficient differences at a heating step or the like in a process of manufacturing a semiconductor integrated circuit device.

Further, in the first embodiment, the cap insulating film 7a and side walls 7b are made of, for example, silicon nitride about 1000–3000 Å thick and serve as etching stoppers when the contact holes 9a1, 9b1 are formed in the inter-layer insulating films 8a, 8b, i.e., serve as films for forming bit line contact holes 9a1 and capacitor contact holes 9b1 between adjacent word lines WL in a self-aligned manner. In other words, the cap insulating film 7a and the side walls 7b define dimensions of the contact holes 9a1 and 9b1 in the width direction of the word lines WL.

Thus, even if the contact holes 9a1 and 9b1 are deviated in the width direction of the word lines WL (lateral direction of FIG. 3), the cap insulating film 7a and the side walls 7b serve as the etching stoppers and consequently exposure of a part of the word line WL to the contact holes 9a1 and 9b1 is prevented. Therefore, alignment tolerance of the contact holes 9a1 and 9b1 can be reduced.

Meanwhile, even if the contact holes 9a1 and 9b1 are deviated in the length direction of the word line WL (vertical direction of FIG. 3), the thickness of the inter-layer insulating films 8a and 8b is secured to some extent and consequently the upper surface of the semiconductor substrate 1s is prevented from being exposed to the contact holes 9a1 and 9b1.

The inter-layer insulating film 8a is, for example, made of $SiO_2$. The inter-layer insulating film 8b is preferably made of BPSG (Boro Phospho Silicate Glass). The inter-layer insulating film 8a functions to prevent boron or phosphorus contained in the inter-layer insulating film 8b located on the film 8a from being diffused to the resulting semiconductor substrate 1s located under the film 8a.

Furthermore, the inter-layer insulating film 8b functions to flatten the underlayer on which wiring conductors are to be formed. Thereby, a photolithography margin can be secured, and the pattern transference accuracy of the contact holes 9a1 and 9b1 and the wiring can be improved.

On the inter-layer insulating film 8b, the inter-layer insulating film 8c made of, for example, $SiO_2$ is formed. If a portion of the cap insulating film 7a is exposed from the inter-layer insulating film 8b, the exposed portion might be etched and the word line WL might be exposed in a bit line forming process which will be described later. The inter-layer insulating film 8c functions to prevent it. In the case where such a problem does not occur, therefore, the inter-layer insulating film Bc may not be provided.

On the inter-layer insulating film 8c, a bit line BL is formed. The bit line BL is formed by forming a conductor film BL2 made of, for example, $WSi_2$ on a conductor film BL1 made of, for example, low-resistance poly-silicon. The bit line BL is electrically connected to the semiconductor region 4a via the contact hole 9a1. The spacing between adjacent bit lines BL is, for example, approximately 0.5–1.0 $\mu$m.

Between the conductor film BL1 and the inter-layer insulating film 8c, a mask film (bit line contact hole formation mask film) 10b used as an etching mask in forming the contact hole 9a1 is left. This mask film 10b is a film for raising the etching selection ratio in forming the contact hole 9a1. The mask film 10b is, for example, made of low-resistance poly-silicon. The mask film 10b is also a part of a bit line BL.

The bit line BL is disposed so as to cross the above described word line WL (preferably so as to be nearly perpendicular to the word line WL) (see FIG. 4). It is not always necessary to square the center line of the bit line BL with the center of the bit contact hole 9a1. In this case, however, the bit line BL needs a projection for completely surrounding the bit line contact hole 9a1.

If the above described projection is formed on the bit line BL, there is a possibility that a short-circuit defect between an adjacent bit line BL and the projection will occur. Therefore, a portion of the bit line BL adjacent to the projection is slightly bent so as to be separated from the projection.

The upper and side surfaces of the bit line BL are covered with a cap insulating film (bit line cap insulating film) 11a and side walls (bit line side wall insulating films) 11b via insulating film 6c and 6d.

The cap insulating film 11a and side walls 11b are made of films having a permittivity lower than a material of the cap insulting film 7a and side walls 7b covering the word lines WL. The films 11 and 11b may be made of, for example, $SiO_2$.

Thereby, a stray capacity accompanying the bit lines BL (hereafter reterred to as a bit line capacity) including a capacity between the bit lines BL and the capacitor electrodes 5c can be decreased. Therefore, it will be possible, for example, to shorten a charge/discharge time of the bit lines BL. It will be also possible to enhance a speed of transmission of a signal flowing in the bit lines BL. Thus, the operation speed of the DRAM can be improved.

Furthermore, the thickness of the cap insulating film 11a and side walls 11b are, for example, in the order of 1000 Å. The cap insulating film 11a and the side walls 11b are covered with an insulating film 12, which serves as an etching stopper in removing an underlying insulating film left after the capacitor 5 has been formed. The insulating film 12 is made of, for example, silicon nitride.

The thickness of the insulating film 12 is set to a value in the range of 100 to 500 Å, preferably to approximately 250 Å. Because a thickness greater than this value causes hydrogen to be seized by the silicon nitride film in final hydrogen annealing processing for terminating a dangling bond and makes a sufficient terminating effect unobtainable.

Over the bit line BL, the capacitor 5 preferably taking a shape of a cylinder is formed. In other words, the DRAM of the present first embodiment has a COB structure. The capacitor 5 is formed by covering the surface of a first electrode 5a with a second electrode 5c via a capacitor insulating film 5b. In the present first embodiment, therefore, capacitive portions are formed on the lower surface side of the first electrode 5a and the side surfaces of the shaft portion of the cylindrincal capacitor 5 as well. As a result, a large capacitance value can be secured.

The first electrode 5a is made of, for example, low-resistance poly-silicon. The first electrode 5a is electrically connected to one semiconductor region 4b of the selection MOS 4 through a conductor film 13 embedded in the contact hole 9b1. The conductor film 13 is preferably made of low-resistance poly-silicon.

The capacitor insulating film 5b is formed by, for example, forming a $SiO_2$ film on a silicon nitride film. The second electrode 5c is made of, for example, low-resistance poly-silicon, and it is electrically connected to predetermined wiring conductors.

A mask film (second capacitor contact hole formation mask film) 10c located under the first electrode 5a of the capacitor 5 is a film which was used as the mask when the contact hole 9b2 was opened. The mask film 10c is made of, for example, low-resistance poly-silicon, and it is a part of the first electrode 5a of the capacitor 5.

With reference to FIG. 2, the p-well 3p and an n-well 3n are formed on the semiconductor substrate 1s in a peripheral circuit region P. In the p-well 3p, preferably boron functioning as a p-type impurity has been introduced. In the n-well 3n, phosphorus or As functioning as an n-type impurity has been introduced. On the p-well 3p and the n-well 3n, an nMOS 14 and a pMOS 15 are formed, for example.

By these nMOS 14 and pMOS15, peripheral circuits of the DRAM such as a sense amplifier circuit, colomn decoder circuit, column driver circuit, row decoder circuit, row driver circuit, I/O selector circuit, data input buffer circuit, data output buffer circuit and power supply circuit are formed.

The nMOS 14 has one pair of semiconductor regions 14a and 14b formed on the p-well 3p so as to be spaced apart from each other, a gate insulating film 14c formed on the resulting semiconductor substrate 1s, and a gate electrode 14d formed on the gate insulating film 14c.

The semiconductor regions 14a and 14b are regions for forming the source region and drain region of the nMOS 14, respectively. In the semiconductor regions 14a and 14b, preferably phosphorus or As functioning as an n-type impurity has been ontroduced. Between the semiconductor regions 14a and 14b, the channel region of the nMOS 14 is formed.

The gate insulating film 14c is made of, for example, $SiO_2$. The gate electrode 14d is formed, for example, by forming a conductor film 14d2 made of $WSi_2$ on a conductor film 14d1 made of low-resistance poly-silicon. The gate electrode 14d may be formed, for example, by a single substance film of low-resistance silicon or may be formed by metal.

On the upper and side surfaces of the gate electrode 14d, a cap insulating film 7a and side walls 7b are formed via an insulating film 6a and insulating films 6b. The insulating films 6a and 6b have the same function as the insulating films 6a and 6b of the above described memory cell region M do, and they are made of, for example, $SiO_2$.

The cap insulating film 7a and the side walls 7b are made of, for example, silicon nitride. In this case, however, the side wall 7b is a film for mainly forming a LDD (Lightly Doped Drain) structure.

The pMOS 15 has one pair of semiconductor regions 15a and 15b formed on the n-well 3n so as to be spaced apart from each other, a gate insulating film 15c formed on the resulting semiconductor substrate 1s, and a gate electrode 15d formed on the gate insulating film 15c.

The semiconductor regions 15a and 15b are regions for forming the source region and drain region of the pMOS 15, respectively. In the semiconductor regions 15a and 15b, for example, phosphorus functioning as a p-type impurity has been introduced. Between the semiconductor regions 15a and 15b, the channel region of the pMOS 15 is formed.

The gate insulating film 15c is, for example, made of $SiO_2$. The gate electrode 15d is formed, for example, by forming a conductor film 15d2 made of $WSi_2$ on a conductor film 15d1 made of low-resistance poly-silicon. The gate electrode 15d may be formed by a single substance film or may be formed by metal.

On the upper and side surfaces of the gate electrode 15d, a cap insulating film 7a and side walls 7b are formed via an insulating film 6a and insulating films 6b. The insulating films 6a and 6b have the same function as the insulating films 6a and 6b of the above described memory cell region M do, and they are made of, example, $SiO_2$.

The cap insulating film 7a and the side walls 7b are made of, for example, silicon nitride. In this case, however, the side wall 7b is a film for mainly forming the LDD structure.

The nMOS 14 and the pMOS 15 are covered with the above described inter-layer insulating films 8a through 8c. On the inter-layer insulating film 8c, the above described insulating film 12 is formed. In the memory cell region M and the peripheral circuit region P, an inter-layer insulating film 8d is formed on the insulating film 12. The second electrode 5c of the capacitor 5 is covered with the inter-layer insulating film 8d.

The inter-layer insulating film 8d is formed by forming an insulating film 8d2 made of, for example, BPSG on an insulating film 8d1 made of, for example, $SiO_2$. The insulating film 8d1 functions to prevent boron or phosphorus contained in the inter-layer insulating film 8d2 located on the film 8d1 from being diffused toward the second electrode 5c of the capacitor 5.

A method for manufacturing the semiconductor device of the present first embodiment will now be described by referring to FIGS. 5a to Sy, 6a to 6d and 7.

As shown in FIG. 5a, the surface of the semiconductor substrate 1s made of a p-type Si single crystal is subjected to thermal oxidation processing. An insulating film 16 having, for example, a thickness of approximately 135 Å made of $SiO_2$ is thus formed. On the upper surface of the insulating film 16, an insulating film 17 having, for example, a thickness of approximately 1400 Å made of silicon nitride is then formed by means of a CVD method.

Subsequently, patterning is conducted by removing a portion of the insulating film 17 located in the isolation region by means of the photolithography technique and dry etching technique. Thereafter, selective oxidation processing is conducted by using the patterned insulating film 17 as a mask. Thereby, an isolating field insulating film 2 is formed on the main surface of the semiconductor substrate 1s as shown in FIG. 5b. The field insulating film 2 is made of, for example, $SiO_2$ and has a film thickness of approximately 4000 Å.

Thereafter, the insulating film 17 is removed by hot phosphoric acid solution. By using a photoresist as a mask, for example, boron functioning as a p-type impurity is then introduced into a predetermined position of the semiconductor substrate 1s by ion implantation. After the photoresist has been removed, the semiconductor substrate 1s is subjected to thermal diffusion processing and consequently the p-well 3p is formed as shown in FIG. 5c.

By using a photoresist as a mask, for example, phosphorus functioning as an n-type impurity is introduced into a predetermined position of the semiconductor substrate 1s by ion implantation. After the photoresist has been removed, the semiconductor substrate 1s is subjected to thermal diffusion processing and consequently the n-well 3n is formed as shown in FIG. 5c.

Subsequently, the insulating film 16 located on the surface of the semiconductor substrate 1s is etched and removed by fluoric acid solution. Thereafter, on the surface of the semiconductor substrate 1s, an insulating film (not illustrated), for example, having a thickness of approximately 100 Å made of $SiO_2$ is formed.

In order to optimize the impurity concentration in the channel region and obtain the threshold voltage of each MOS, predetermined impurity ions are implanted into the main surface of the active region.

As shown in FIG. 5c, the insulating film located on the surface of the resulting semiconductor substrate 1s is etched and removed by means of fluoric acid solution. On the surface of the resulting semiconductor substrate 1s, the gate insulating film 4c of the selection MOS and the gate insulating films 14c and 15c of the MOS forming the peripheral circuit are formed. The gate insulating film 4c is formed, for example, by using the thermal oxidation method. The film thickness of the gate insulating film 4c is approximately 90 Å.

Subsequently, on the upper surface of the resulting semiconductor substrate 1s, a conductor film 18d1 made of, for example, low-resistance poly-silicon with phosphorus introduced therein and a conductor film 18d2 made of $WSi_2$ are formed in order as shown in FIG. 5d. The conductor films 18d1 and 18d2 are formed, for example, by using the CVD method. The conductor films 18d1 and 18d2 are preferably 700 Å and 1500 Å in thickness, respectively.

On the upper conductor film 18d2, the insulating film 6a made of, for example, $SiO_2$ and the insulating film 7a made of silicon nitride are then formed in order. The insulating film 6a and the cap insulating film 7a are formed preferably by using the CVD method.

In forming the cap insulating film 7a, the insulating film 6a functions to prevent the inside of the film forming apparatus from polluted with the metal contained in the conductor film 18d2 and to alleviate the stress to be applied to the cap insulating film 7a during a heat treatment or the like. The thickness of the insulating film 6a is preferably in the range of approximately 100 to 500 Å.

The cap insulating film 7a functions as an etching stopper in a contact hole forming process which will be described later. Preferably, the cap insulating film has a thickness of approximately 2000 Å.

Subsequently, by using a photoresist as a mask, the cap insulating film 7a, the insulating film 6a, and the conductor films 18d1 and 18d2 exposed from the photoresist are etched and removed in order as shown in FIG. 5e. Thereby, the gate electrodes 4d (word line WL), 14d and 15d are formed in the memory cell region M and the peripheral circuit region P.

Subsequently, the above described photoresist is removed. Thereafter, the resulting semiconductor substrate 1s is subjected to thermal oxidation processing. Thereby, the thin insulating film 6b made of, for example, $SiO_2$ is formed on side surfaces of the gate electrodes 4d, 14d and 15d.

By using the gate electrodes 14d and 15d as masks, phosphorus ions functioning as an n-type impurity and boron ions functioning as a p-type impurity are then implanted respectively in the nMOS forming region and the pMOS forming region of the peripheral circuit region as shown in FIG. 5f. Thereby, semiconductor regions 14a1, 14b1, 15a1 and 15b1 having low impurity concentration values are formed.

Subsequently, phosphorus ions functioning as an n-type impurity are implanted in the selection MOS forming region of the memory cell region M, with the gate electrode 4d used as a mask. The n-type impurity are subjected to diffusion. Thereby, the semiconductor regions 4a and 4b forming the sorce region and the drain region of the selection MOS 4 are formed. To the semiconductor regions 4a and 4b, a bit line and a capacitor are later connected, respectively.

Subsequently, an insulating film made of, for example, silicon nitride is formed on the resulting semiconductor substrate 1s by using the CVD method. Thereafter, the insulating film is etched back by using an anisotropic dry etching method such as reactive ion etching (RIE). Thereby, the side walls 7b are formed on the side surfaces of the gate electrodes 4d, 14d and 15d.

The source region and the drain region of the selection MOS 4 may be formed in a LDD (Lightly Doped Drain) structure by forming such side walls 7b and then implanting arsenic (As) ions in the main surface of the p-well 3p with a concentration higher than the above described phosphorus functioning as an n-type impurity.

By using the gate electrodes 14d and 15d covered with the cap insulating film 7a and the side walls 7b as a mask, phosphorus ions functioning as an n-type impurity and boron ions functioning as a p-type impurity are then implanted respectively in the nMOS forming region and the pMOS forming region of the peripheral circuit region P. Thereby, semiconductor regions 14a2, 14b2, 15a2 and 15b2 having high impurity concentration values are formed. As a result, the semiconductor regions 14a, 14b, 15a and 15b of the nMOS 14 and pMOS 15 in the peripheral circuit region P are formed.

Subsequently, on the resulting semiconductor substrate 1s, the inter-layer insulating film 8a made of, for example, $SiO_2$ is formed by using the CVD method as shown in FIG. 5g. Thereafter, on the inter-layer insulating film 8a, the inter-layer insulating film (first flattening insulating film) 8b made of, for example, BPSG is formed by using the CVD method. As a result, at least the cap insulating film 7a and the side walls 7b each made of a nitride film and located on the gate electrode 4d are in contact with the insulating film 8a made of an oxide film and are covered therewith.

Subsequently, the upper surface of the inter-layer insulating film 8b is flattened by using the CMP (Chemical Mechanical Polishing) method. Thereafter, on the inter-layer insulating film 8b, a mask film (first capacitor contact hole formation mask film) 10a made of, for example, low-resistance poly-silicon with phosphorus introduced therein is formed by using the CVD method.

Thereafter, by using a photoresist as a mask, the mask film 10a is patterned by using the dry etching method. Thereby, a pattern of the mask film 10a which is to be used to open portions of films above semiconductor regions 4b of the selection MOS 4 is formed.

In the present first embodiment, the upper surface of the inter-layer insulating film 8b underlying the mask film 10a is flattened. Therefore, a sufficient photolithography margin can be secured, and favorable pattern transference onto the film 8b is possible. In the peripheral circuit region P, the entire upper surface of the inter-layer insulating film 8b is covered with the mask layer 10a.

The reason why low-resistance poly-silicon is used as the mask film 10a will hereafter be described. First, the etching selection ratio with respect to the silicon oxide films 8a and 8b, through which contact holes for the capacitor 5 are opened as described below, can be increased. Secondly, since the material embedded in the contact hole is low-resistance poly-silicon, the mask film 10a which is the lower layer can be simultaneously removed in etch-back processing of the low-resistance poly-silicon conductor film formed at the time of embedding the material.

However, the constituent material of the mask film 10a is not limited to poly-silicon, but can be changed diversely. For example, the constituent material may be silicon nitride.

By using the mask film 10a as an etching mask, the inter-layer insulating films 8a and 8b exposed from the mask film 10a are then removed, for example, by using the dry etching method. Thereby, the contact hole (capacitor lower contact hole) 9b1 is formed so as to expose the semiconductor region 4b of the selection MOS 4 as shown in FIG. 5h. The contact hole 9b1 has a diameter of approximately 0.3 to 0.4 μm.

In the present first embodiment, the cap insulating film 7a and the side walls 7b brought into contact with and covered with the insulating films 8a and 8b, through which the contact hole 9b1 is formed, are formed by silicon nitride. Therefore, the selection ratio of the insulating films 8a and 8b with respect to silicon nitride in dry etching processing is high. As a result, the cap insulating film 7a and the side walls 7b function as etching stoppers. Accordingly, the minute contact hole 9b1 can be formed in a self-aligned manner with a high aligning precision.

Even if the position of the opening of the mask film 10a, for example, is somewhat deviated in the width direction (lateral direction in FIG. 5h) of the word line WL, the cap insulating film 7a and the side walls 7b are made of silicon nitride and function as etching stoppers and consequently any part of the word line WL will not be exposed to the contact hole formed by using the mask film as an etching mask.

Furthermore, even if the position of the opening of the mask film 10a is deviated in a direction of extension of the word line WL, the underlying field insulating film 2 has a sufficiently large thickness and consequently the contact hole formed by using the mask film as an etching mask does not reach the upper part of the resulting semiconductor substrate 1s.

In the present first embodiment, therefore, the alignment margin of the contact hole 9b1 set equal to a larger value by considering the mis-alignment can be reduced. Therefore, the area of the memory cell region M can be reduced.

The dry etching conditions at this time will now be exemplified. The selection ratio between the inter-layer insulating films 8a and 8b and the cap insulating film 7a and the side walls 7b is, for example, in the range of approximately 10 to 15. The reaction gas is $C_4F_8/CF_4/CO/Ar$ gas, for example, with approximately 3/5/200/550 sccm, respectively. The pressure is, for example, 100 mTorr. The RF power is, for example, 1000 watts. The processing temperature in an etching apparatus is, for example, approximately 20/60/−10° C. on the upper electrode/wall surface/lower electrode, respectively.

Subsequently, on the resulting semiconductor substrate 1s, the conductor film 13 made of, for example, low-resistance poly-silicon with phosphorus introduced therein is formed by using the CVD method as shown in FIG. 5i. Thereafter, the conductor film 13 is etched back by using the dry etching method. Thereby, the conductor film 13 is embedded in only the contact hole 9b1 as shown in FIG. 5j. At the time of this etch-back processing, the mask film 10a of the lower layer (see FIG. 5i) is also removed.

Thereafter, on the conductor film 13 and the insulating film 8b, the insulating film (first insulating film) 8c made of, for example, $SiO_2$ is formed by using the CVD method as shown in FIG. 5k. The inter-layer insulating film 8c has a thickness in the range of, for example, approximately 500 to 1000 Å.

Subsequently, on the inter-layer insulating film 8c, the mask film (bit line contact hole formation mask film) 10b made of, for example, low-resistance poly-silicon is formed by using the CVD method. The thickness of the mask film 10b is, for example, in the range of 500 to 3000 Å.

Subsequently, by using a photoresist as a mask, the mask film 10b is subjected to patterning using dry etching processing. Over the semiconductor region 4a, an opening is thus formed in the mask film 10b. Thereafter, the inter-layer insulating films 8a through 8c in the region exposed to the opening are etched and removed by using dry etching processing.

Thereby, the contact hole (bit line contact hole) 9a1 is formed so as to expose the semiconductor region 4a of the selection MOS 4 as shown in FIG. 5l. The contact hole 9a1 has, for example, a diameter of approximately 0.3 to 0.4 µm.

In the present first embodiment, the cap insulating film 7a and the side walls 7b brought into contact with and covered with the insulating films 8a and 8b, through which the contact hole 9a1 is formed, are formed by silicon nitride. Therefore, the selection ratio of the insulating films 8a and 8b with respect to silicon nitride in dry etching process is high. As a result, the cap insulating film 7a and the side walls 7b function as etching stoppers. Accordingly, the minute contact hole 9a1 can be formed in a self-aligned manner with a high aligning precision.

Even if the position of the opening of the mask film 10b, for example, is somewhat deviated in the width direction (lateral direction in FIG. 5l) of the word line WL, the cap insulating film 7a and the side walls 7b are made of silicon nitride and function as etching stoppers and consequently a part of the word line WL is not exposed from the contact hole formed by using the mask film as an etching mask.

Furthermore, even if the position of the opening of the mask film 10a is deviated in a direction of extension of the word line WL, the underlying field insulating film 2 has a sufficiently large thickness and consequently the contact hole formed by using the mask film as an etching mask does not reach the upper part of the resulting semiconductor substrate 1s.

In the present first embodiment, therefore, the alignment margin of the contact hole 9a1 set equal to a larger value by considering the misalignment can be reduced. Therefore, the area of the memory cell region M can be reduced.

The dry etching conditions at this time will now be exemplified. The selection ratio between the inter-layer insulating films 8a and 8b and the cap insulating film 7a and the side walls 7b is preferably in the range of approximately 10 to 15. The reaction gas is preferably $C_4F_8/CF_4/CO/Ar$ gas, for example, with approximately 3/5/200/550 sccm, respectively. The pressure is, for example, approximately 100 mTorr. The RF power is, for example, approximately 1000 watts. The processing temperature in an etching apparatus is, for example, approximately 20/60/−10° C. on the upper electrode/wall surface/lower electrode, respectively.

Subsequently, on the resulting semiconductor substrate 1s, the conductor film BL1 made of, for example, low-resistance poly-silicon with phosphorus introduced therein and the conductor film BL2 made of, for example, $WSi_2$ are formed in order by using the CVD method as shown in FIG. 5m. Subsequently, on the conductor film BL2, the insulating film 6c made of $SiO_2$ and the cap insulating film 11a made of $SiO_2$ are formed in order by using the CVD method. The cap insulating film 11a has, for example, a thickness of approximately 1000 Å.

Subsequently, on the cap insulating film 11a, a photoresist 19a is formed so as to cover the bit line forming region. By using the photoresist 19a as an etching mask, the cap insulating film 11a, the insulating film 6c, the conductor films BL2 and BL1, and the mask film 10b exposed from the mask are then etched and removed in order.

Thereby, the bit line BL including the conductor films BL1 and BL2 and the mask film 10b is formed as shown in FIG. 5n. The bit line BL is electrically connected to one semiconductor region 4a of the selection MOS 4 through the contact hole 9a1.

Subsequently, the photoresist 19a (see FIG. 5m) is removed. Thereafter, the resulting semiconductor substrate 1 is subjected to thermal oxidation processing. Thereby, the thin insulating film 6d made of, for example, $SiO_2$ is formed on the side surfaces of the conductor films BL1 and BL2 and the mask film 10b included in the bit line BL as shown in FIG. 5o.

Thereafter, on the resulting semiconductor substrate 1s, an insulating film made of, for example, $SiO_2$ is formed by using the CVD method. Thereafter, the insulating film is etched and removed by using an anisotropic dry etching method such as the RIE. As a result, the side walls 11b are formed on the side surfaces of the bit line BL.

In this way, in the first embodiment, the cap insulating film 11a and side walls 11b covering the bit lines BL are made of $SiO_2$ having a permittivity lower than silicon nitride, thereby making it possible to reduce the bit line capacity to improve the operation speed of the DRAM.

Subsequently, on the resulting semiconductor substrate 1s, the insulating film 12 made of silicon nitride, for example, having a thickness in the range of approximately 100 to 500 Å, more preferably having a thickness of approximately 250 Å is formed by using the CVD method. The insulating film 12 functions as an etching stopper in a wet etching removal process of the underlying insulating subsequent to the capacitor forming processing which will be described later.

Subsequently, on the insulating film 12 over the substrate 1s, an insulating film (second flattering insulating film) 20 made of, for example, BPSG (Boro-Phospho-Silicate Glass) is formed by using the CVD method so as to contact the film 12 with the film 20 and cover the film 12 with the film 20 as shown in FIG. 5p. Thereafter, the upper surface of the insulating film 20 is flattened by a heating process. The insulating film 20 may be formed with $SiO_2$ by using the CVD method, and in such a case, the flattering of the upper surface of the film may be effected by, for example, the CMP method.

Thereafter, on the resulting semiconductor substrate 1s, a mask film (second capacitor contact hole formation mask film) 10c made of, for example, low-resistance poly-silicon with phosphorus introduced therein is formed by using the CVD method. In this case, the mask film 10c has, for example, a thickness in the range of approximately 500 to 2000 Å.

Subsequently, in the mask film 10c, an opening is formed in the capacitor contact hole forming region by using the photolithography technique and the dry etching technique. In this case, the opening has a diameter in the order of 0.35 µm which corresponds to a critical minimum patterning width or smaller.

Subsequently, as shown in FIG. 5q, a mask film (side wall mask film) 10c1 of, for example, low-resistance poly-silicon with phosphorus introduced thereinto is formed on the resulting semiconductor substrate 1s so as to cover the above-mentioned mask film 10c by using the CVD method. The mask film 10c1 has, for example, a thickness in the order of 500 to 2000 Å.

Thereafter, the mask film 10c1 is etched back by the dry etching method or the like so as to leave portions of the mask film 10c1 only on the side surfaces of the underlying mask film 10c, as shown in FIG. 5r.

Thus, the provision of the side wall films of portions of the mask film 10c1 at edges of the openings makes it possible to reduce sizes of the openings. The openings have, for example, a size in the order of 0.2 µm or less.

As a result, it is possible to increase tolerance range for alignment at formation of capacitor contact holes to be described later, and therefore, it will be no longer necessary to form capacitor contact holes in self-alignment by use of the insulating films provided around the bit lines. Namley, it is now possible to form, with a material having a low permittivity, the cap insulating films 11a and side walls 11b covering the bit lines BL, even though the material has an etching rate higher than the material of the cap insulating films 7a and side walls 7b covering the word lines 4d.

Furthermore, diameters of the capacitor contact holes are reduced with a result that an alignment margin for the capacitor contact holes may be set smaller, which will contribute to promotion of reduction of the size of memory cells MC (see FIG. 1).

Next, an upper hole of a capacitor contact hole is to be formed, using the mask films 10c and 10c1 as a mask. In this first embodiment, the formation of the upper hole is effected, for example, in two etching steps.

First, as shown in FIG. 5s, first partial contact holes 9b2a of the capacitor upper contact holes are formed, by etching using the mask films 10c and 10c1 as a mask, to a depth such that the insulating film 12 made of silicon nitride is removed. This first etching step employs a non-selective etching in which the partial cotact holes 9b2a are formed by a dry etching process or the like which is strongly anisotropic, to thereby suppress undesirable increase of the diameters of the holes 9b2a.

Subsequently, as shown in FIG. 5t, second partial contact holes 9b2b are formed, by using the mask films 10c and 10c1 as a mask, to remove the insulating films remaining in the first partial contact holes 9b2a to expose the upper surfaces of the conductor films 13.

This second etching step employs a selective etching to complete the capacitor contact holes 9b2b in which the insulating film 8c of SiO2 remaining in the partial contact hole 9b2a is removed and the nitride film 12 is hard to be etched. Partial contact holes 9b2a and 9b2b form capacitor upper contact holes 9b2 (FIG. 1).

The dry etching conditions at this time will now be exemplified. The selection ratio between the nitride films and the oxide films is, for example, approximately 10 to 15. The reaction gas is, for example, $C_4F_8/CF_4/CO/Ar$ gas preferably with approximately 3/5/200/550 sccm, respectively. The pressure is, for example, approximately 100 mTorr. The RF power is, for example, approximately 1000 watts. The processing temperature in an etching apparatus is, for example, approximately 20/60/–10° C. on the upper electrode/wall surface/lower electrode, respectively. The contact holes 9b2a, 9b2b have, for example, a diameter in the order of 0.3 to 0.4 µm.

A simplified top view of a main part of the memory cell region M at this stage is shown in FIG. 7. Sectional views thereof taken along lines VU1—VU1 and VU2—VU2 are shown in FIGS. 5u1 and 5u2, respectively.

In the first embodiment, as shown in FIGS. 5u1 and 5u2, the provision of the mask film 10c1 makes it possible to make the contact holes 9b2a, 9b2b smaller. Therefore, it is no longer necessary to form the contact holes 9b2a, 9b2b in self-alignment by use of the insulating films formed around the bit lines BL.

Furthermore, even if the position of the opening defined by the mask films 10c, 10c1 (see FIG. 5q) is deviated in the direction of extension (lateral direction in FIG. 7) of the bit line BL, the cap insulating film 7a and the side walls 7b covering the underlying word line WL are made of silicon nitride and function as etching stoppers as understood from FIG. 5u1 and consequently any part of the word line WL is not exposed to the contact holes 9b2a, 9b2b.

Subsequently, on the mask layer 10c, the conductor film 5a having a thickness in the range of approximately 500 to 1000 Å made of, for example, low-resistance poly-silicon with phosphorus introduced therein is formed. On the upper surface of the conductor film 5a, an insulating film 21 having a thickness in the range of approximately 3000 to 6000 Å made of, for example, $SiO_2$ is then formed by using the plasma CVD method.

The conductor film 5a and the insulating film 21 are formed in the contact holes 9b1 and 9b2 as well, and the film 5a is electricallly connected to the other semiconductor region 4b of the selection MOS 4 through the conductor film 13.

The insulating film 21 on the conductor film 5a is made of an insulating film having a higher etch rate in wet etching processing than that of the underlying insulating film 20 made of the BPSG or $SiO_2$. The reason will now be described. It is now assumed that the etching rate of the insulating film 21 is lower than that of the insulating film 20. The insulating film 21 is embedded also in a narrow hollow located at the center of the first electrode 5a (see FIG. 1). In simultaneously removing the insulating film 21 and the insulating film 20 in a subsequent process, therefore, the insulating film 20 is removed before the insulating film 21 is sufficiently removed. If the etching rate of the insulating film 21 is lower than that of the insulating film 20, therefore, a bad influence is exerted upon underlying devices in some cases.

Figure 5V:
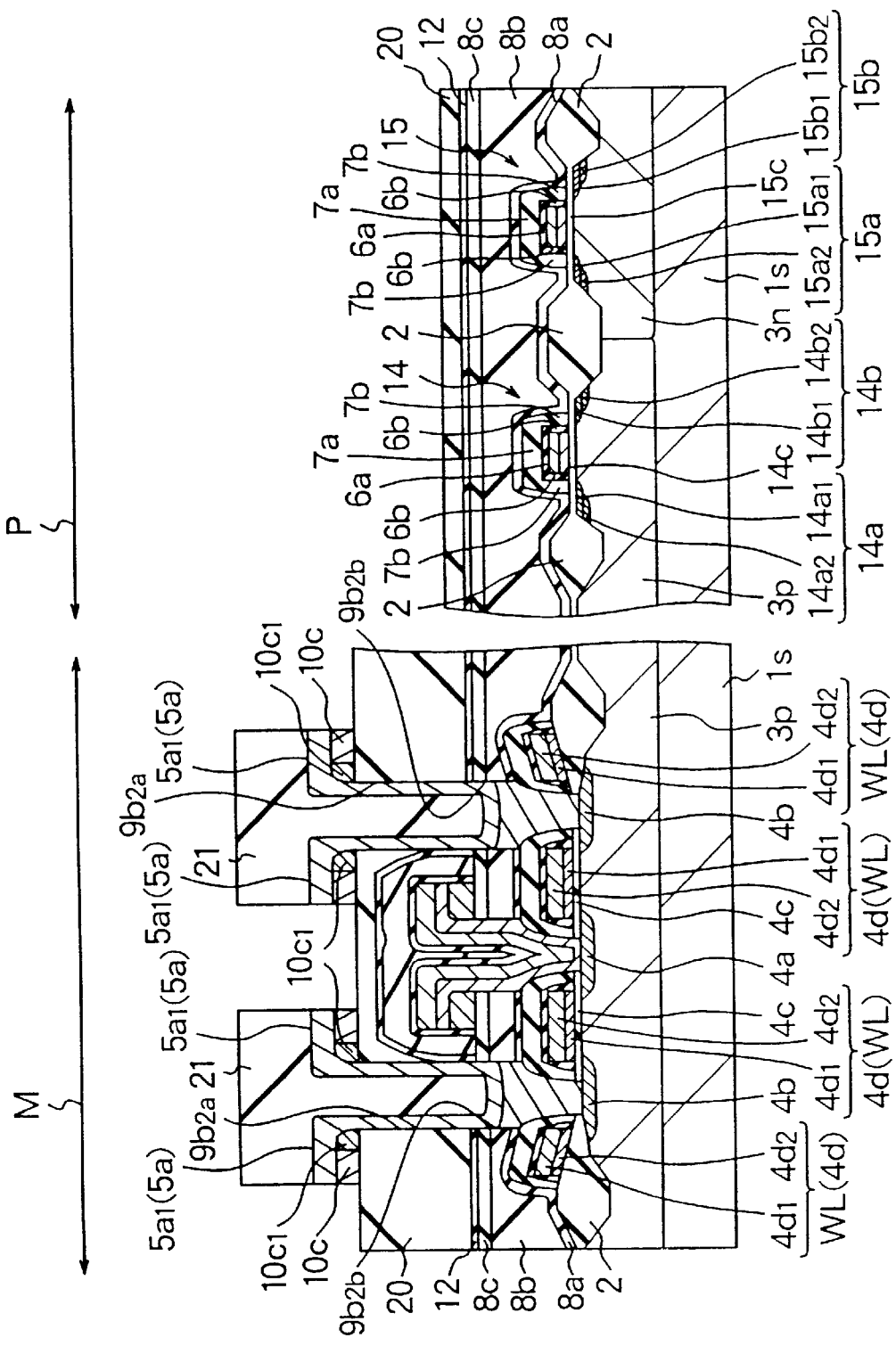

Subsequently, in the insulating film 21, the conductor film 5a and the mask layer 10c, portions exposed from the photoresist are etched and removed by using the dry etching method. Thereby, a lower portion 5a1 of the first electrode 5a of the capacitor and the insulating film 21 are formed as shown in FIG. 5v.

Figure 5W:
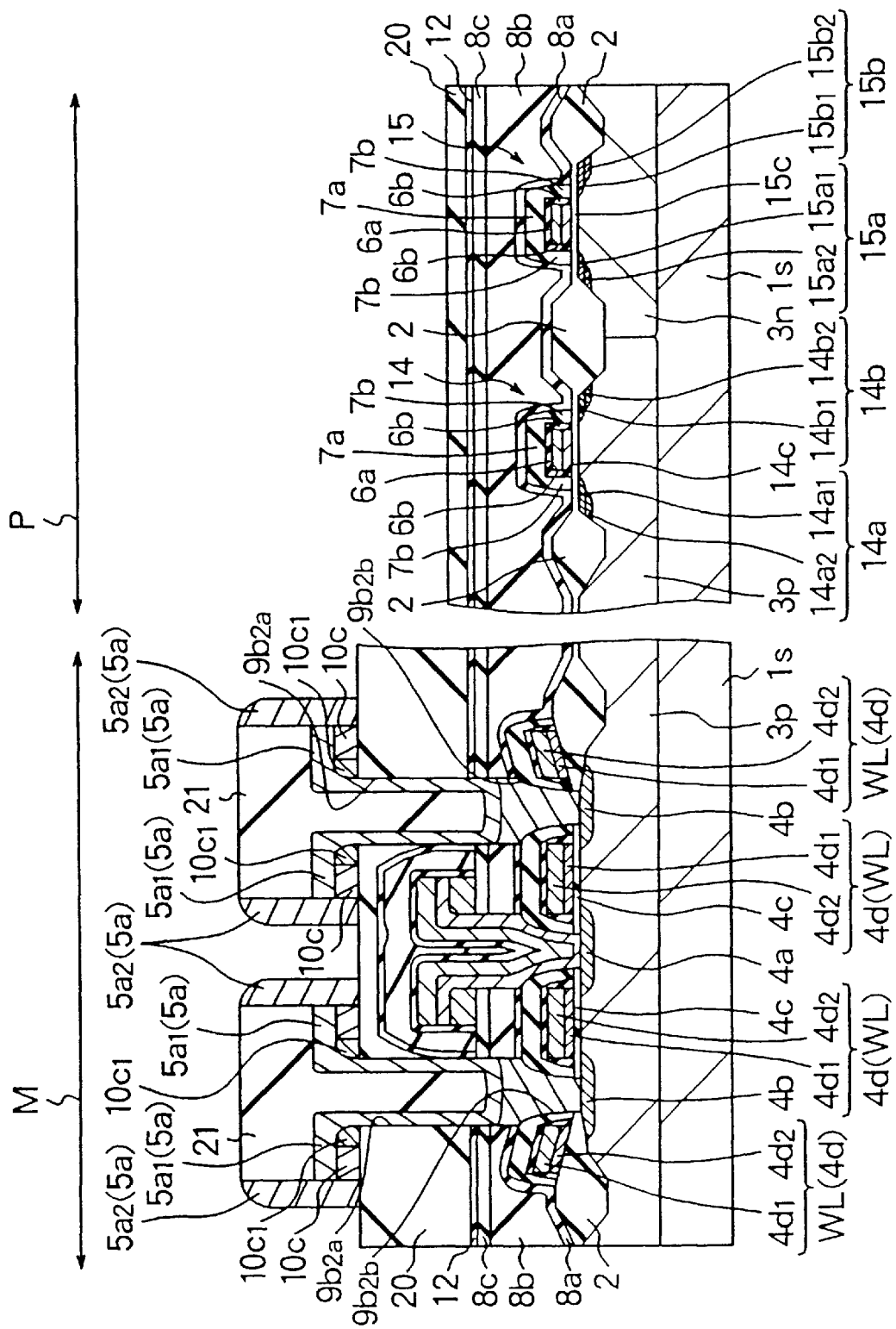

Thereafter, on the resulting semiconductor substrate 1s, a conductor film made of low-resistance poly-silicon is formed by using the CVD method. Thereafter, the conductor film is etched back by using an anisotropic dry etching method such as the RIE. Thereby, side portions 5a2 of the first electrode 5a of the capacitor are formed on side surfaces of the insulating film 21 as shown in FIG. 5w.

Subsequently, the insulating films 20 and 21 are removed by, for example, wet etching using a fluoric acid solution. Thereby, the first electrode 5a of a cylindrical capacitor is formed as shown in FIG. 5x. At this time, the insulating film 12 formed on the inter-layer insulating film 8c functions as the stopper for the wet etching and consequently the underlying inter-layer insulating film 8c is not removed.

Subeuently, on the resulting semiconductor substrate 1s, a silicon nitride film (not illustrated) is formed by using the CVD method as shown in FIG. 5y. Thereafter, the silicon nitride film is subjected to oxidation processing. Thereby, a $SiO_2$ film is formed on the surface of the silicon nitride film, and the capacitor insulating film 5b including the silicon nitride film and the $SiO_2$ film is formed.

Thereafter, a conductor film made of, for example, low-resistance poly-silicon is formed on the resulting semiconductor substrate 1s by using the CVD method. By using a photoresist as a mask, this conductor film is etched. Thereby the second electrode 5c of the capacitor 5 is formed, and the capacitor 5 is formed.

Subsequently, on the resulting semiconductor substrate 1s, an insulating film 8d1 made of, for example, $SiO_2$ is formed by using the CVD method. Thereafter, on the insulating film 8d1, the insulating film 8d2 made of, for example, BPSG is formed. The upper surface of the insulating film 8d2 is flattened preferably by using the CMP method.

Subsequently, wiring conductor forming process follows. The wiring conductor forming process will now be described by referring to FIGS. 6a through 6d. Although FIGS. 6a through 6d show sectional views of a portion different from that of FIGS. 5a through 5y to explain the wiring conductor forming process, FIGS. 6a through 6d are sectional views of the same DRAM.

First of all, an inter-layer insulating film 8e made of, for example, SiO$_2$ is formed on the resulting semicondutor substrate by using the CVD method as shown in FIG. 6a. Thereby the capacitor 5 is covered.

By using a photoresist as a mask, a contact hole 22a is formed in the inter-layer insulating film 8e so as to expose a pad portion of the second electrode 5c of the capacitor 5. Together therewith, a contact hole 22b is formed by using dry etching processing so as to expose one semiconductor region 23a of a MOSFET 23 in the peripheral circuit region P.

Thereafter, on the resulting semiconductor substrate 1s, a conductor film made of, for example, titanium (Ti) is formed by the sputtering method. On the upper surface of the conductor film, a conductor film made of, for example, tungsten is then formed by using the CVD method. On the upper surface of the conductor film made of tungsten, a conductor film made of, for example, titanium nitride (TiN) is formed by using the sputtering method.

Subsequently, with a photoresist used as a mask, the laminated conductor film is subjected to patterning by using the dry etching method. Thereby, a first level interconnection 24a is formed as shown in FIG. 6b.

Subsequently, on the resulting semiconductor substrate 1s, an inter-layer insulating film 8f made of, for example, SiO$_2$ is formed by using the CVD method so as to cover the first level interconnection 24a. Thereafter, the inter-layer insulating film 8f is subjected to dry etching processing by using a photoresist as a mask. Thereby, a contact hole 22c is formed so as to expose a part of the first level interconnection 24a.

Thereafter, a second level interconnection 24b is formed on the inter-layer insulating film 8f as shown in FIG. 6c. The second level interconnection 24b is formed, for example, as described below.

First of all, a conductor film made of, for example, tungsten is formed by using the CVD method. On the upper surface of the conductor film, a conductor film made of, for example, aluminum (Al) is formed by using the sputtering method. Furthermore, on the upper surface of the conductor film made of aluminum, a conductor film made of, for example, TiN is formed by using the sputtering method. Thereafter, the laminated conductor film is subjected to patterning in the same way as the first level interconnection 24a. The second level interconnection 24b is thus formed.

Subsequently, on the inter-layer insulating film 8f, an inter-layer insulating film 8g made of, for example, SiO$_2$ is formed to cover the second level interconnection 24b by using the CVD method. Therafter, by using a photoresist as a mask, the inter-layer insulating film 8g is subjected to dry etching processing. Thereby, a contact hole 22d is formed so as to expose the second level interconnection 24b.

Subsequently, a third level interconnection 24c is formed on the inter-layer insulating film 8g as shown in FIG. 6d. The third level interconnection 24c may be formed by the same material and the same method as the second level interconnection 24b uses.

Finally, on the resulting semiconductor substrate 1s, a surface protection film 25 preferably made of, for example, SiO$_2$ is formed to cover the third level interconnection 24c by using the CVD method. Thereby, the wafer process of the DRAM in the present first embodiment is finished.

The present first embodiment can enjoy the following effects.

(1) Since the bit line contact hole 9a1 and the capacitor contact holes 9b1 and the capacitor contact holes 9b1 and 9b2 can be formed in a self-aligning manner, it becomes possible to make alignment in photolithography between those contact holes 9a1, 9b1 and 9b2 and each layer.

(2) By making the etching selection ratio of the insulating films (the film 5b of FIG. 5i and the film 20 of FIG. 5p) covering the cap insulating film and the side walls (the films 7a and 7b of FIG. 5i and the films 11a and 11b of FIG. 5p) with respect to the cap insulating film and the side walls, the upper surface of the underlying insulating film (the film 8b of FIG. 5g and the film 20 of FIG. 5p) can be flattened in forming the bit line contact hole 9a1 and the capacitor contact holes 9b1 and 9b2. Therefore, the margin in the photolithography for forming the contact holes 9a1, 9b1 and 9b2 can be improved and the pattern transferrence precision can be improved.

(3) Because of (1) and (2), the slignment tolerance of the bit line contact hole 9a1 and the capacitor contact holes 9b1 and 9b2 can be reduced. Therefore, the size of the memory cell MC can be reduced. As a result, the size of the semiconductor chip can be reduced.

(4) Because of (1) and (2), contact faults in the bit line contact hole 9a1 and the capacitor contact holes 9b1 and 9b2 can be reduced. Therefore, the yield and reliability of the DRAMs can be improved.

(5) Because of (1) and (2), any sophiscated aligning technique or process control is not required for forming the bit line contact hole 9a1 and the capacitor contact holes 9b1 and 9b2. Furthermore, it is not necessary to introduce a sophisticated and expensive photolithography technique such as the phase shift technique for enhancing the resolution of the transcription pattern.

(6) The cap insulating film 7a and the side walls 7b of the memory cell region M can be formed concurrently with the cap insulating film 7a and the side walls 7b for forming the LDD structure of the MOSFET in the peripheral circuit region P. A significant increase in manufactiong process is not caused.

(7) Because of (5) and (6), the time of period for developing the semiconductor devices having DRAMs can be shortened.

(8) Because the side wall films made of portions of the mask film 10c1 are formed on the side walls of the openings in the mask film 10c by use of which the capacitor contact holes 9b2a, 9b2b are to be formed, it is possible to reduce the opening size.

(9) Because of (8), it is possible to increase tolerance range for alignment at formation of capacitor contact holes 9b2a, 9b2b. Therefore, it is no longer necessary to to form capacitor contact holes 9b2a, 9b2b in self-alignment by use of the insulating films provided around the bit lines BL.

(10) Because of (8), it is possible to reduce the diamemters of the capacitor contact holes 9b2a, 9b2b and to make small an alignment margin for the capacitor contact holes, which will contribute to promotion of reduction of the size of memory cells MC.

(11) Because the cap insulating film 11a and side walls 11b covering the bit lines BL is made of $SiO_2$ which has a permittivity lower than that of a material of the cap insulating film 7a and side walls 7b covering the word lines WL, it is possible to reduce the bit line capacity.

(12) Because of (11), it is possible to shorten a charge/discharge time of the bit lines BL and to improve the speed of transmission of a signal flowing in the bit lines BL, so that the operation speed of the DRAM can be enhanced.

(13) Because of (11), it is possible to secure a sufficient amount of signal which is determined by a ratio between the storage capacity of the capacitor and the bit line capacity, so that reliability at data readout from the memory cells can be enhanced.

(14) Because of (13), reliablity at data readout from the memory cells MC can be enhanced.

(15) Because of (13), it is possible to reduce the occupation area of the capacitors 5, so that size reduction of the semiconductor integrated circuit device can be promoted.

(Embodiment 2)

Figure 8:
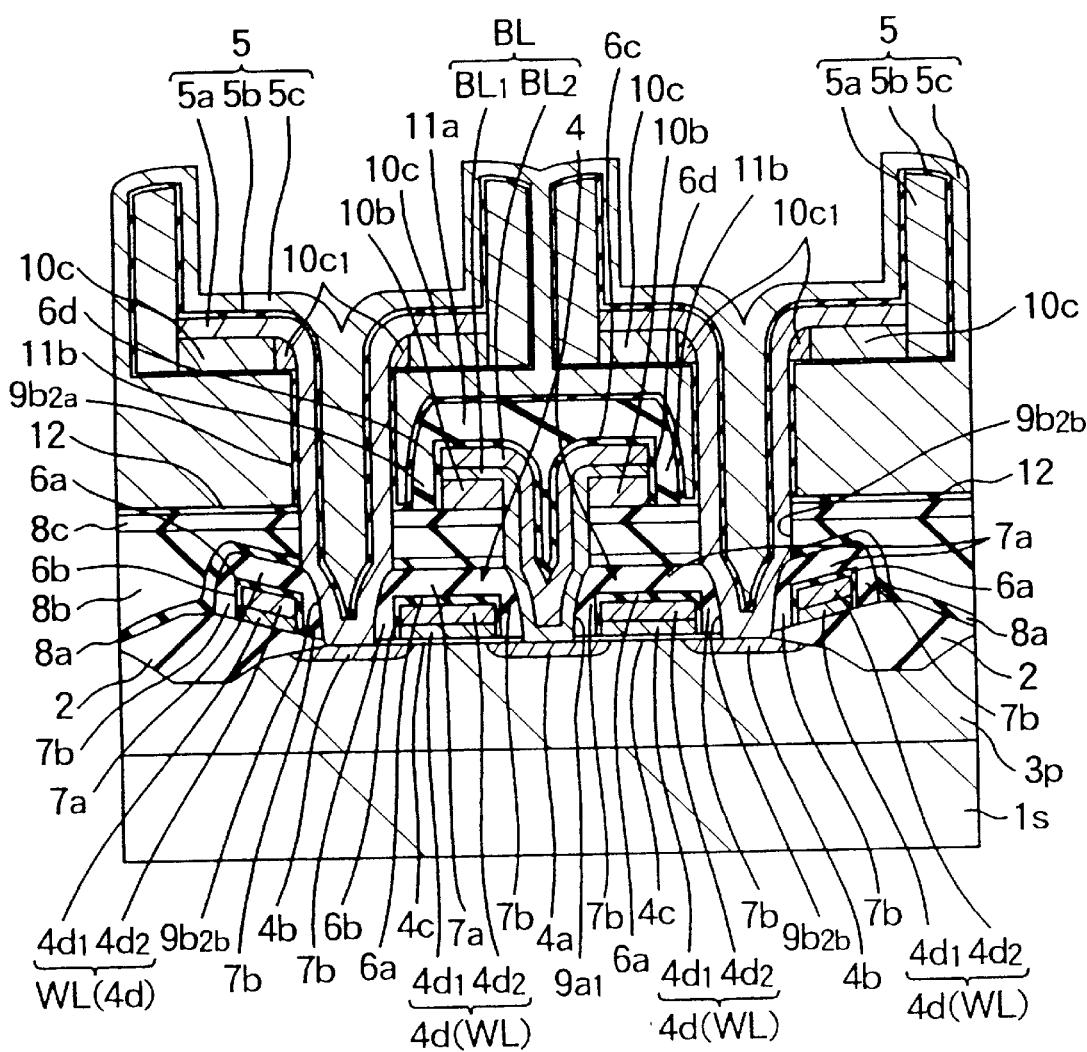
FIG. 8 is a sectional view of a main part of a memory cell region of a memory device included in a semiconductor integrated circuit device according to one embodiment of the present invention.

FIG. 8 is a sectional view of a main part of a memory cell region included in a semiconductor integrated circuit device according to another embodiment of the present invention, and FIGS. 9a through 9f are sectional views of the device illustrating a method of manufacturing the semiconductor integrated circuit device shown in FIG. 8.

The semiconductor integrated circuit device of the present embodiment shown in FIG. 8 is an example of the case where the conductor film 13 to be embedded as shown in the above described embodiment 1 is not formed in contact holes for a capacitor 5.

In the present embodiment 2 as well, a cap insulating film 11a and side walls 11b surrounding a bit line BL are made of, for example, $SiO_2$ or the like having a permittivity lower than a material of a cap insulating film 7a and side walls 7b covering the word line WL. In the present embodiment 2 as well, therefore, the bit line capacity can be decreased.

Furthermore, in the present embodiment 2, not only the upper surface of the bit line BL but also the side surfaces thereof are covered with a second electrode 5c of the capacitor 5. This is because the hole diameters of capacitor contact holes 9b2a and 9b2b can be made smaller and accordingly the gap between the shaft part of the capacitor 5 and the bit line BL can be made larger.

As a result, not only the upper surface of the bit line BL but also the side surfaces thereof can be shielded with the second electrode 5c of the capacitor 5. Therefore, electrical coupling between the bit line BL and wiring conductors surrounding it can be decreased, resulting in such a structure that the signal-to-noise ratio of the bit line BL can be improved.

A method of manufacturing a semiconductor integrated circuit device in the present embodiment 2 will now be described by referring to FIGS. 9a through 9f.

The method for manufacturing a semiconductor integrated circuit device in the present embodiment 2 may be made substnatially the same as the method for manufacturing a semiconductor integrated circuit device described with reference to the embodiment 1. Therefore, process for forming contact holes for capacitors relating to a portion differing in structure from the above described embodiment 1 will now be described.

Figure 9A:
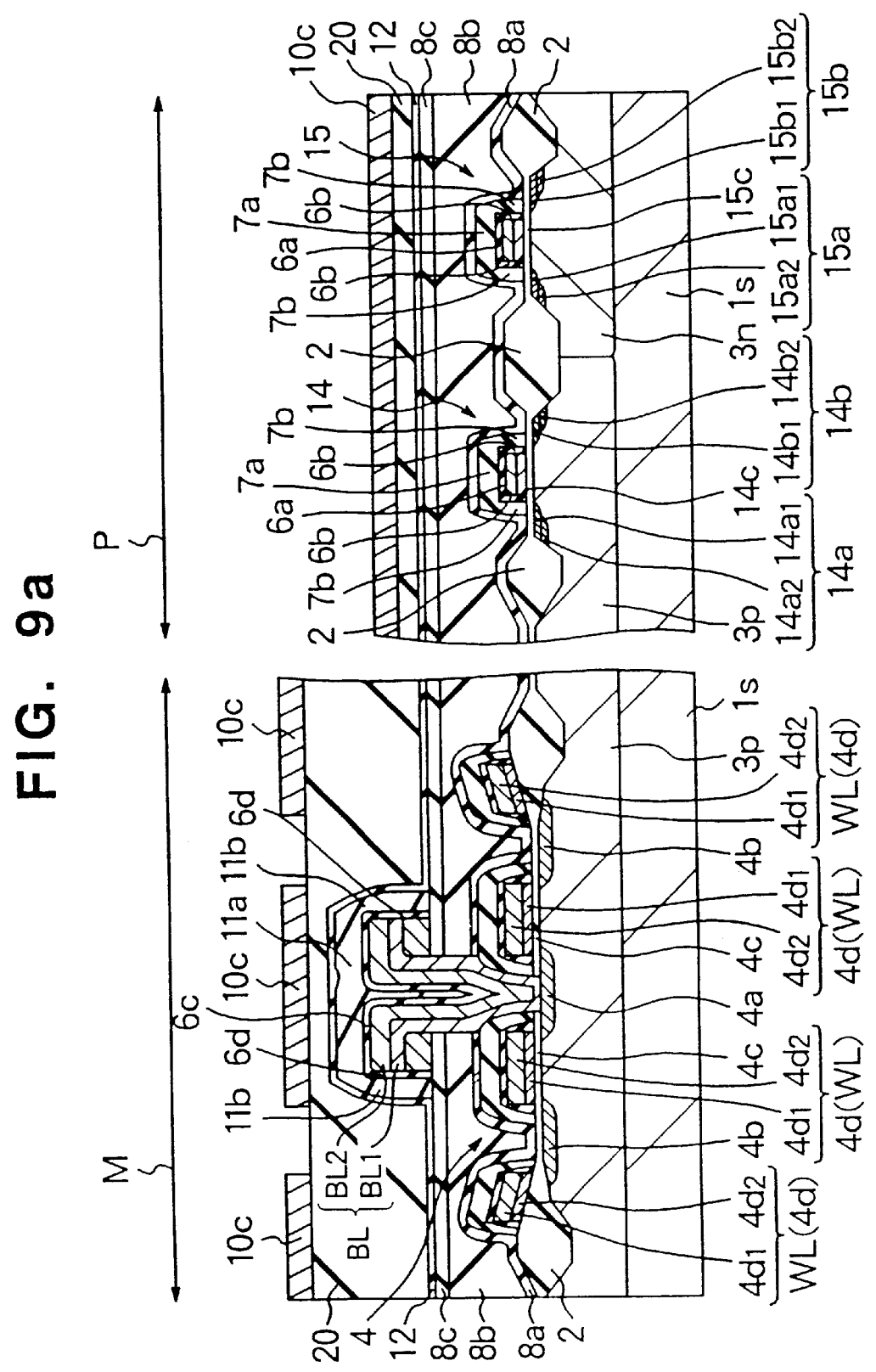

FIG. 9a is a diagram showing the semiconductor integrated circuit device of FIG. 8 in a process of manufacturing the semiconductor integrated circuit device, and FIG. 9a is a diagram corresponding to FIG. 5p used in the description of the above described embodiment 1.

Around the bit line BL, insulating films 6c and 6d covering the bit line, a cap insulating film 11a, side walls 11b, and an insulating film 12 are formed in the same way as the above described embodiment 1.

On the insulating film 12, an insulating film 20 is formed in the same way as the the above described embodiment 1. This insulating film 20 is formed by using, for example, a BPSG film. The upper surface of the insulating film 20 is formed so as to become flat.

Furthermore, on the insulating film 12, a pattern of a mask film 10c made of, for example, low-resistance poly-silicon is formed. The material, thickness, opening dimension, forming method, and so on of this mask film 10c are the same as the above described embodiment 1 has. In the present embodiment 2, the conductor film 13 (FIG. 5p) is not formed at this step. However, the opening dimension is smaller than that of the above described embodiment 1, and it is 0.3 $\mu$m.

On such a semiconductor substrate 1s, a mask film 10c1 made of, for example, low-resistance poly-silicon with phosphorus introduced therein is formed so as to cover the above described mask film 10c by using the CVD method as shown in FIG. 9b. In this case, the mask film 10c1 has a thickness in the range of, for example, approximately 500 to 2000 Å.

Subsequently, this mask film 10c1 is etched back by the dry etching method or the like so as to leave portions of the mask film 10c1 only on the side surfaces of openings of the underlying mask film 10c, as shown in FIG. 9c.

Thus, the provision of the side wall films of portions of the mask film 10c1 at edges of the openings of the mask film 10c makes it possible to reduce sizes of the openings. The openings have a size of, for example, 0.15 $\mu$m.

As a result, it is possible to increase the tolerance for alignment at the time of formation of capacitor contact holes which will be described later. Therefore, it will be no longer necessary to form capacitor contact holes in self-alignment by use of the insulating films provided around the bit lines BL.

Next, a capacitor contact hole is formed by using the mask films 10c and 10c1 as an etching mask. In the present embodiment 2, the formation of the capacitor contact hole is effected, for example, in two etching steps. This aims at preventing overetching from forming the contact hole deeper than need be.

First, as shown in FIG. 9d, contact holes 9b2a are formed, by etching using the mask films 10c and 10c1 as a mask, to a depth such that the insulating film 12 made of silicon nitride is removed.

However, this etching step employs a non-selective etching in which the contact holes 9b2a are formed by a dry ectching process or the like which is strongly anisotropic, to thereby suppress undesirable increase of the diameters of the holes 9b2a.

Figure 9E:
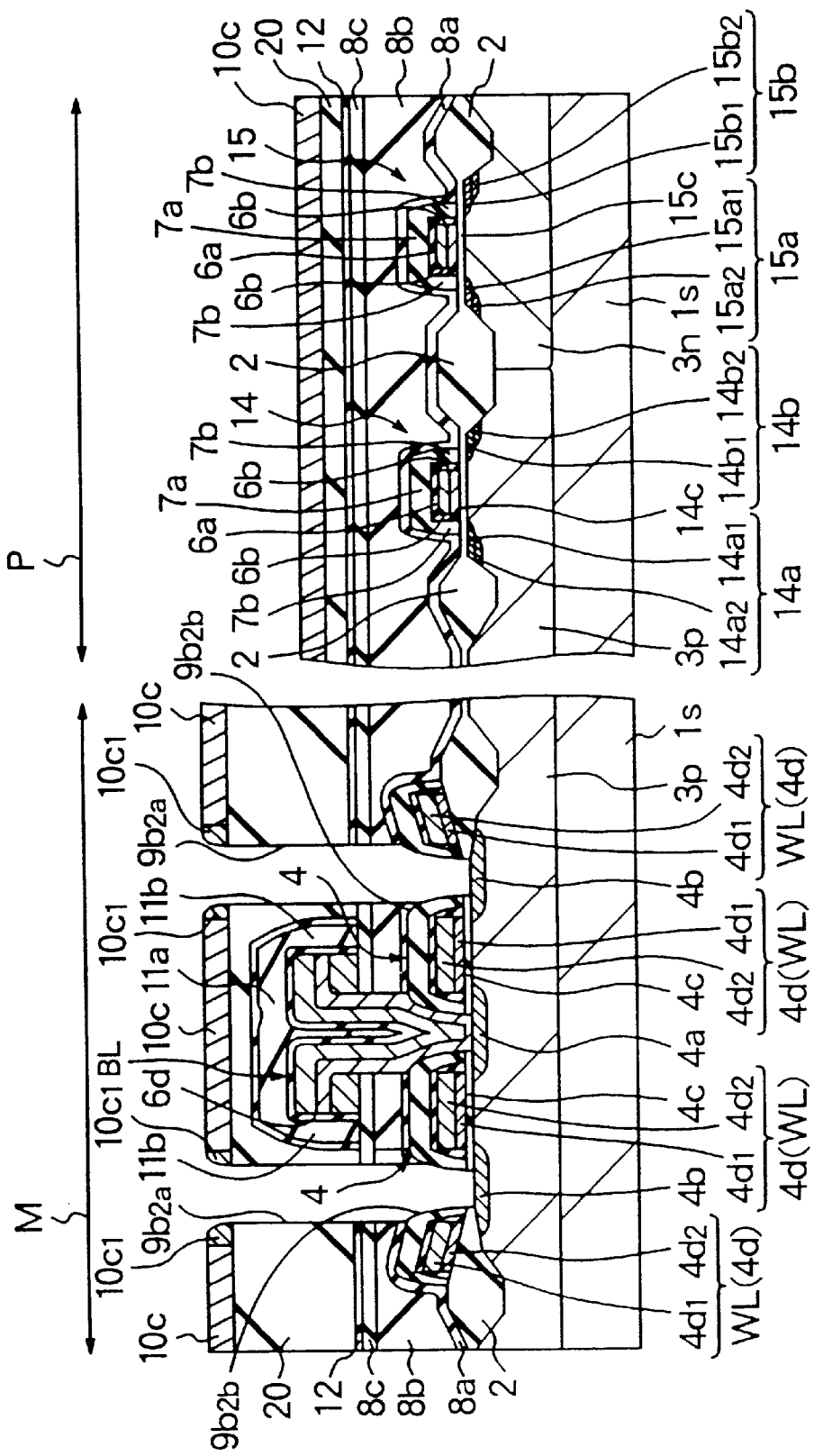

Subsequently, as shown in FIG. 9e, contact holes 9b2b are formed, by using the mask films 10c and 10c1 as a mask, to remove the insulating films 8c, 8b and 8a remaining in the contact holes 9b2a to expose the upper surfaces of the semiconductor regions 4b.

However, this etching step employs a selective etching to complete the capacitor contact holes 9b2b in which the insulating film of $SiO_2$ remaining in the contact hole 9b2a is removed. Contact holes 9b2a and 9b2b form capacitor contact holes 9b2 (FIG. 8).

In the present embodiment 2 as well, the cap insulating film 7a and the side walls 7b are formed by silicon nitride. Therefore, the cap insulating film 7a and the side walls 7b function as etching stoppers. Accordingly, the minute contact hole 9b1 can be formed in a self-aligned manner with a high aligning precision.

Even if the position of the opening of the mask film 10c, for example, is somewhat deviated in the width direction (lateral direction in FIG. 41) of the word line WL, the cap insulating film 7a and the side walls 7b are made of silicon nitride and function as etching stoppers and consequently any part of the word line WL will not be exposed to the contact hole formed by using the mask film as an etching mask.

Furthermore, the provision of the side wall of the mask film 10c1 at edges of the openings of the mask film 10c makes it possible to reduce sizes of the openings. Therefore, the tolerance of the mis-alignment of the contact holes 9b2b can be made large.

Furthermore, even if the position of the opening of the mask film 10c is deviated in a direction of extension of the word line WL, the underlying field insulating film 2 has a sufficiently large thickness and consequently the contact hole formed by using the mask film as an etching mask does not reach the upper part of the resulting semiconductor substrate 1s.

In the present embodiment 2 as well, therefore, the alignment margin of the contact hole 9b2b set equal to a larger value by considering the mis-alignment can be reduced. Therefore, the area of the memory cell region M can be reduced.

The dry etching conditions at this time will now be exemplified. The selection ratio is, for example, in the range of approximately 10 to 15. The reaction gas is, for example, $C_4F_8/CF_4/CO/Ar$ gas, with, for example, approximately 3/5/200/550 sccm, respectively. The pressure is, for example, approximately 100 mTorr. The RF power is, for example, approximately 1000 watts. The processing temperature in an etching apparatus is, for example, approximately 20/60/$-10°$ C. on the upper electrode/wall surface/lower electrode, respectively. Each of the contact holes 9b2a and 9b2b has a diameter, for example, in the range of approximately 0.3 to 0.4 $\mu$m.

Subsequently, on the mask layer 10c, the conductor film having a thickness in the range of approximately 500 to 1000 Å made of, for example, low-resistance poly-silicon with phosphorous introduced therein is formed. On the upper surface of the conductor film, an insulating film having a thickness in the range of approximately 3000 to 6000 Å made of, for example, $SiO_2$ is then formed by using the plasma CVD method.

This conductor film is formed in the contact holes 9b2a1 and 9b2b as well, and electricaly connected to the other semiconductor region 4b of the selection MOS 4 through the conductor film.

The insulating film on this conductor film is made of an insulating film having a higher etch rate in wet etching processing than that of the underlying insulating film 20 made of the BPSG. The reason will now be described. It is now assumed that the etching rate of the insulatng film is lower than that of the insulatng film 20. The insulating film is embedded also in a narrow hollow located at the center of the first electrode of the capacitor. In simultaneously removing the insulating film and the insulating film 20 in a subsequent process, therefore, the insulating film 20 is removed before the insulating film is sufficiently removed. If the etching rate of the insulating film is lower than that of the insulating film 20, therefore, a bad influence is exerted upon underlying devices in some cases.

Figure 9F:
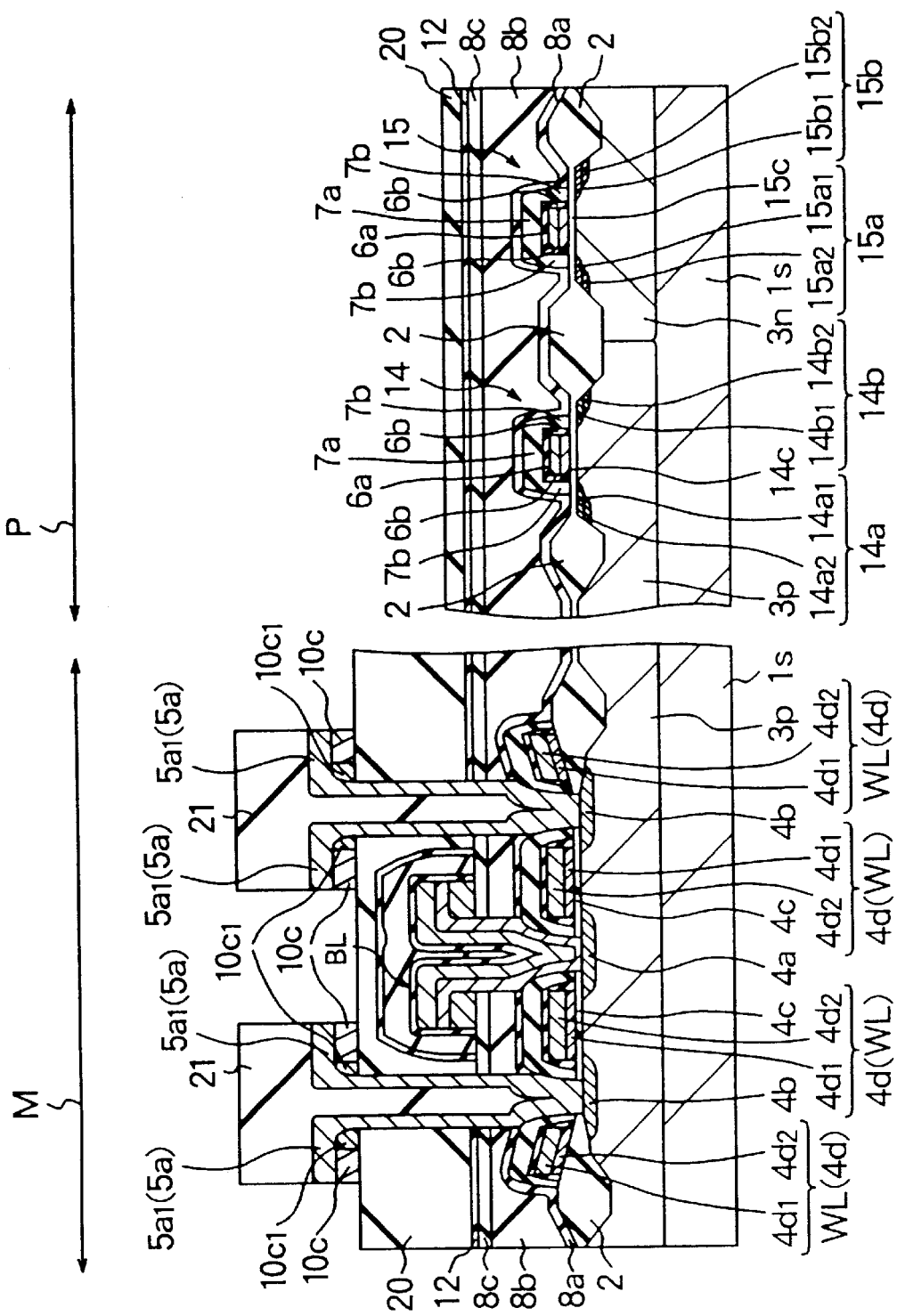

Subsequently, in the insulating film, the conductor film and the mask layer 10c, portions exposed from the photo-resist are etched and removed by using the dry etching method. Thereby, a lower portion 5a1 of the first electrode 5a of the capacitor and the insulating film 21 are formed as shown in FIG. 9f.

Subsequent manufacturing processes are the same as those of the above described embodiment 1, and description thereof will be omitted.

In the present embodiment 2, the following effects can be thus obtained besides the effects obtained in the above described embodiment 1.

(1) Since the upper and side surfaces of the bit line BL are covered with the second electrode 5c of the capacitor 5, not only the upper surface of the bit line BL but also the side surfaces thereof can be shielded by the second electrode 5c of the capacitor 5. Therefore, the electric coupling between the bit line BL and wiring conductors located near it can be reduced. As a result, the signal-to-noise ratio of the bit line BL can be improved.

Heretofore, the invention made by the present inventors has been concretely described on the basis of preferred embodiments. However, the present invention is not limited to the above described embodiments 1 and 2. It is a matter of course that the present invention can be modified diversely without departing from the spirit of the present invention.

By referring to the embodiments 1 and 2, for example, the case where the memory cell has a cylindrical capacitor has been described. However, the shape of the capacitor is not limited to this, but it can be modified diversely. For example, the capacitor may take the shape of a fin.

By referring to the embodiments 1 and 2, the case where the bit line is formed by disposing a silicide layer on low-resistance poly-silicon has been described. However, the structure of the bit line is not limited to this. For example, the bit line may be formed by using the silicide layer alone. In this case, the bit line BL can be made thin.

In the embodiments 1 and 2, the cap insulating film 11a and the side walls 11b located around the bit line are made of $SiO_2$. However, the cap insulating film and the side walls may be made of silicon nitride.

In that case, however, the cap insulating film 11a and the side walls 11b covering the bit line are made larger in thickness than the cap insulating film 7a and the side walls 7b covering the word line.

For example, in the case where the cap insulating film and the side walls covering the word line are in the range of 1000 to 3000 Å in thickness, the cap insulating film and the side walls covering the bit line need only be larger than the values in thickness.

By determining the film thickness as described above, the bit line capacity can be reduced. Therefore, the same effects as the above described embodiment 1 provides are obtained.

Furthermore, in the above described embodiments 1 and 2, the technique of attempting to make the contact holes small by forming side wall films on edges of the mask film was used in the process for forming the upper contact holes 9b2a for the capacitor. However, the present invention is not limited to this, but the technique may be used in the process for forming the lower contact holes 9b1-for the capacitor before forming the embedded capacitor conductor film, or may be used in the process for forming the bit line contact holes 9a1 which is used to connect the bit line to the semiconductor region of the memory selection MOSFET.

Thereby, the hole diameter of those contact holes can be reduced, and consequently the alignment margin can be made small. As a result, it becomes possible to push on with making the memory cell smaller.

Heretofore, the case where the invention made by the present inventors is applied to DRAMs forming its background field has been principally described. However, its application is not limited to this, but the present invention can be applied to various fields. For example, the present invention can be applied to SRAMs, ROMs, logic circuits, or other semiconductor devices having a semiconductor memory circuit and a logic circuit disposed on the same semiconductor substrate.

What is claimed is:

1. A method of manufacturing a semiconductor integrated circuit device having a DRAM including word lines, bit lines, capacitor elements, and memory cell selection transistors using the word line as a gate electrode, formed over a semiconductor substrate, comprising the steps of (a) forming a first cap insulating film and a first sidewall spacer of the word line;

(b) forming a first interlayer insulating film over the first cap insulating film and the first sidewall spacer;

(c) etching the first interlayer insulating film to form a first contact hole exposing a first semiconductor region of the memory cell selection transistor in a self-alignment manner with the word lines;

(d) forming a first conductor film in the first contact hole;

(e) etching the first interlayer insulating film to form a second contact exposing a second semiconductor region of the memory cell selection transistor in a self alignment manner with the word lines;

(f) forming a second conductor film over the first interlayer insulating film and in the second contact hole;

(g) forming a first insulating film over the second conductor film;

(h) patterning the second conductor film and the first insulating film to form the bit line and a second cap insulating film of the bit line;

(i) forming second sidewall spacers of the bit line;

(j) forming a second interlayer insulating film over the bit line;

(k) forming a first mask film over the second interlayer insulating film (l) forming an opening in the first mask film;

(m) forming a second mask film on the first mask film and in the opening;

(n) removing a part of the second mask film to form a sidewall mask film on a side surface of the opening in the first mask film;

(o) etching the second interlayer insulating film to form a third contact hole; and (p) forming the capacitor element over the second interlayer insulating film, electrically connected to the first conductor film via the third contact hole;

wherein in the steps (c) and (e), an etching rate of the first interlayer insulating film is larger than an etching rate of the first cap insulating film and the first sidewall spacer of the word line;

in the step (o), the first mask film and the sidewall mask film are used as an etching mask; and permittivity of the second cap insulating film and the second sidewall spacer of the bit line is smaller than permittivity of the first cap insulating film and the first sidewall spacer of the word line.

2. A method of manufacturing a semiconductor integrated circuit device according to claim 1, wherein the first cap insulating film and the first sidewall spacer of the word line are comprised of silicon nitride; and the second cap insulating film and the second sidewall spacer of the bit line are comprised of silicon oxide.

3. A method of manufacturing a semiconductor integrated circuit device according to claim 2, wherein the first mask film and the second mask film are comprised of poly crystal silicon; and the second interlayer insulating film is comprised of silicon oxide.

4. A method of manufacturing a semiconductor integrated circuit device according to claim 3, wherein a diameter of the opening after the step (n) is smaller than a diameter of the opening in the step (I).

5. A method of manufacturing a semiconductor integrated circuit device according to claim 3, wherein the third contact hole and the second sidewall spacer are not in contact with each other.

6. A method of manufacturing a semiconductor integrated circuit device according to claim 3, wherein in the step (n), the part of the second mask film is removed by an anisotropic etching process.

7. A method of manufacturing a semiconductor integrated circuit device according to claim 3, wherein the first mask film and the sidewall mask film are used as a lower electrode of the capacitor element.

* * * * *